United States Patent
Landig et al.

(10) Patent No.: US 11,407,211 B1
(45) Date of Patent: Aug. 9, 2022

(54) FABRICATION OF SHAPED VOIDS

(71) Applicant: Facebook Technologies, LLC, Menlo Park, CA (US)

(72) Inventors: Renate Eva Klementine Landig, Seattle, WA (US); Kenneth Diest, Kirkland, WA (US); Sheng Ye, Redmond, WA (US); Andrew John Ouderkirk, Redmond, WA (US)

(73) Assignee: Facebook Technologies, LLC, Menlo Park, CA (US)

(\*) Notice: Subject to any disclaimer, the term of this patent is extended or adjusted under 35 U.S.C. 154(b) by 313 days.

(21) Appl. No.: 16/669,970

(22) Filed: Oct. 31, 2019

Related U.S. Application Data

(60) Provisional application No. 62/777,825, filed on Dec. 11, 2018.

(51) Int. Cl.
*B32B 27/20* (2006.01)
*B29C 55/00* (2006.01)
(Continued)

(52) U.S. Cl.
CPC .......... *B32B 27/205* (2013.01); *B29C 55/005* (2013.01); *B32B 38/0012* (2013.01);
(Continued)

(58) Field of Classification Search
CPC ... B32B 27/205; B32B 38/0012; B32B 38/10; B32B 27/304; B32B 33/00;
(Continued)

(56) References Cited

U.S. PATENT DOCUMENTS 3,215,583 A \* 11/1965 Holme .................... B29C 70/12
428/95
3,985,599 A \* 10/1976 Lepoutre .................. B32B 5/00
156/271
(Continued)

FOREIGN PATENT DOCUMENTS

| CA | 2737458 A1 | 3/2010 | |
| EP | 0807459 A1 \* | 11/1997 | .............. B01J 31/06 |
| WO | 2011088161 A1 | 7/2011 | |

OTHER PUBLICATIONS

Mullin et al., "Pattern Transformation Triggered by Deformation", Physical Review Letters, vol. 99, No. 8, 084301, Aug. 22, 2007, 4 pages.
(Continued)

*Primary Examiner* — Linda L Gray
(74) *Attorney, Agent, or Firm* — FisherBroyles, LLP

(57) ABSTRACT

In some examples, a method includes forming a material layer on a substrate, partially polymerizing a component of the material layer, to form fluid-filled droplets within a partially polymerized matrix, deforming the material layer to form anisotropic fluid-filled droplets, and further polymerizing the partially polymerized matrix to form an anisotropic voided polymer, including anisotropic voids in a polymer matrix. The anisotropic voids may include anisotropic nanovoids. Example methods may further include depositing electrodes on the anisotropic voided polymer so that at least a portion of the anisotropic voided polymer is located between the electrodes. Examples may include forming electroactive elements including an anisotropic nanovoided polymer, and devices (such as sensors and/or actuators) including electroactive elements.

16 Claims, 17 Drawing Sheets

(51) Int. Cl.
| | |
|---|---|
| *B32B 38/00* | (2006.01) |
| *B32B 38/10* | (2006.01) |
| *B32B 33/00* | (2006.01) |
| *B32B 27/30* | (2006.01) |
| *B82Y 30/00* | (2011.01) |

(52) U.S. Cl.
CPC .............. *B32B 38/10* (2013.01); *B29C 55/00* (2013.01); *B32B 27/304* (2013.01); *B32B 33/00* (2013.01); *B32B 2038/0028* (2013.01); *B32B 2305/026* (2013.01); *B82Y 30/00* (2013.01)

(58) Field of Classification Search
CPC ...... B32B 2038/0028; B32B 2305/026; B29C 55/005; B29C 55/00; B82Y 30/00
See application file for complete search history.

(56) References Cited

U.S. PATENT DOCUMENTS

| | | | |
|---|---|---|---|
| 4,613,544 A * | 9/1986 | Burleigh | A61L 15/425 |
| | | | 427/245 |
| 5,095,515 A | 3/1992 | Seaver | |
| 6,420,441 B1 | 7/2002 | Allen et al. | |
| 6,488,721 B1 | 12/2002 | Carlson | |
| 6,628,850 B1 | 9/2003 | Yao | |
| 7,002,754 B2 | 2/2006 | Baer et al. | |
| 7,230,771 B2 | 6/2007 | Kuiper et al. | |
| 8,477,402 B2 | 7/2013 | Duncan et al. | |
| 8,564,181 B2 | 10/2013 | Choi et al. | |
| 8,848,280 B2 | 9/2014 | Arsenault | |
| 9,228,822 B2 | 1/2016 | Majidi et al. | |
| 9,820,481 B2 | 11/2017 | Hani et al. | |
| 9,923,180 B2 | 3/2018 | Thomas-Alyea et al. | |
| 10,670,782 B2 | 6/2020 | Arbabi et al. | |
| 10,690,946 B2 | 6/2020 | Wilson | |
| 10,749,448 B2 | 8/2020 | Lindsay et al. | |
| 10,797,217 B2 | 10/2020 | Hakkens et al. | |
| 11,022,856 B1 | 6/2021 | Ouderkirk et al. | |
| 11,025,175 B1 | 6/2021 | Landig et al. | |
| 2002/0009251 A1 | 1/2002 | Byrne | |
| 2002/0135863 A1 | 9/2002 | Fukshima et al. | |
| 2002/0186928 A1 | 12/2002 | Curtis | |
| 2005/0007675 A1 | 1/2005 | Matsumoto et al. | |
| 2005/0196552 A1 | 9/2005 | Lehmann et al. | |
| 2006/0024976 A1 | 2/2006 | Waldfried et al. | |
| 2006/0028734 A1 | 2/2006 | Kuiper et al. | |
| 2007/0020404 A1 | 1/2007 | Seiberle et al. | |
| 2007/0205398 A1 | 9/2007 | Smela et al. | |
| 2007/0263963 A1 | 11/2007 | Hughes et al. | |
| 2008/0137031 A1 | 6/2008 | Hillis et al. | |
| 2008/0171431 A1 | 7/2008 | Yu et al. | |
| 2008/0197518 A1 | 8/2008 | Aylward et al. | |
| 2008/0224103 A1 | 9/2008 | Arsenault et al. | |
| 2009/0034051 A1 | 2/2009 | Arsenault et al. | |
| 2009/0296188 A1 | 12/2009 | Jain et al. | |
| 2010/0075056 A1 | 3/2010 | Axisa et al. | |
| 2011/0149410 A1 | 6/2011 | Blum | |
| 2011/0242638 A1 | 10/2011 | Horning et al. | |
| 2012/0019185 A1 | 1/2012 | Guidarelli et al. | |
| 2012/0029416 A1 | 2/2012 | Parker et al. | |
| 2012/0200931 A1 | 8/2012 | Haag et al. | |
| 2012/0211261 A1 | 8/2012 | Aabloo et al. | |
| 2012/0298200 A1 | 11/2012 | Niggemann et al. | |
| 2013/0176628 A1 | 7/2013 | Batchko et al. | |
| 2013/0202867 A1 | 8/2013 | Coggio et al. | |
| 2013/0222881 A1 | 8/2013 | Aizenberg et al. | |
| 2013/0279151 A1 | 10/2013 | Ouderkirk et al. | |
| 2013/0335807 A1 | 12/2013 | Arsenault et al. | |
| 2014/0133010 A1 | 5/2014 | Han et al. | |
| 2014/0204372 A1 | 7/2014 | Pang et al. | |
| 2014/0217539 A1 | 8/2014 | Rantala | |
| 2014/0234995 A1 | 8/2014 | Li et al. | |
| 2014/0266647 A1 | 9/2014 | Visitacion et al. | |
| 2014/0312737 A1 | 10/2014 | Jenninger et al. | |
| 2014/0323603 A1* | 10/2014 | Kolb | C08J 9/0004 |
| | | | 521/149 |
| 2014/0326292 A1* | 11/2014 | Yordem | H02S 40/22 |
| | | | 136/246 |
| 2015/0109657 A1 | 4/2015 | Baumberg et al. | |
| 2015/0205126 A1 | 7/2015 | Schowengerdt | |
| 2015/0241698 A1 | 8/2015 | Schowengerdt | |
| 2015/0259493 A1 | 9/2015 | Nederkoorn et al. | |
| 2015/0315012 A1 | 11/2015 | Wiersma et al. | |
| 2016/0036353 A1 | 2/2016 | Stasik et al. | |
| 2016/0103341 A1 | 4/2016 | Long et al. | |
| 2016/0187985 A1 | 6/2016 | Lim et al. | |
| 2016/0283773 A1 | 9/2016 | Popovich et al. | |
| 2017/0023807 A1 | 1/2017 | Chang-Hasnain et al. | |
| 2017/0031078 A1 | 2/2017 | Thompson et al. | |
| 2017/0090570 A1 | 3/2017 | Rain et al. | |
| 2017/0192595 A1 | 7/2017 | Choi et al. | |
| 2017/0285348 A1 | 10/2017 | Ayres et al. | |
| 2017/0365630 A1 | 12/2017 | Yang | |
| 2018/0093456 A1 | 4/2018 | Van Overmeere et al. | |
| 2018/0164627 A1 | 6/2018 | Oh | |
| 2018/0356303 A1 | 12/2018 | Li et al. | |
| 2019/0296218 A1 | 9/2019 | Ouderkirk et al. | |
| 2019/0361318 A1 | 11/2019 | Johnson et al. | |
| 2020/0076328 A1 | 3/2020 | Cha et al. | |
| 2020/0183168 A1 | 6/2020 | Spann et al. | |
| 2020/0183199 A1 | 6/2020 | Diest et al. | |
| 2020/0183200 A1 | 6/2020 | Diest et al. | |
| 2020/0185590 A1 | 6/2020 | Malhotra et al. | |

OTHER PUBLICATIONS

Babaee et al., "3D Soft Metamaterials with Negative Poisson's Ratio", Advanced Materials, vol. 25, No. 36, Jul. 22, 2013, pp. 5044-5049.

Bertoldi et al., "Negative Poisson's Ratio Behavior Induced by an Elastic Instability", Advanced Materials, vol. 22, No. 3, Jan. 13, 2010, pp. 361-366.

Overvelde et al., "Relating pore shape to the non-linear response of periodic elastomeric structures", Journal of the Mechanics and Physics of Solids, vol. 64, Mar. 2014, pp. 351-366.

Ren et al., "Design and characterisation of a tuneable 3D buckling-induced auxetic metamaterial", Materials & Design, vol. 139, Feb. 5, 2018, pp. 336-342.

Correa et al., "Negative stiffness honeycombs for reoverable shock isolation", Rapid Prototyping Journal, vol. 21, No. 2, Mar. 16, 2015, pp. 193-200.

Coulais et al., "Discontinuous Buckling of Wide Beams and Metabeams", Physical Review Letters, vol. 115, No. 4, Jul. 21, 2015, 7 pages.

Bickel et al., "Design and Fabrication of Materials with Desired Deformation Behavior", ACM Transactions on Graphics, vol. 29, No. 4, Article 63, Jul. 1, 2010, pp. 1-10.

Rosset et al., "Small, fast, and tough: Shrinking down integrated elastomer transducers", Applied Physics Review, vol. 3, No. 3, Article 031105, Sep. 26, 2016, pp. 1-20.

Plante et al., "Large scale failure modes of dielectric elastomer actuators", International Journal of Solids and Structures, vol. 43, Mar. 29, 2006, pp. 7727-7751.

Optotune, "Electroactive Polymers", URL: https://optotune.com/technology/electroactive-polymers, retrieved on Apr. 30, 2020, 3 pages.

Novasentis, "Haptic Actuators", URL: https://novasentis.com/product, retrieved on Apr. 30, 2020, 4 pages.

Rosset et al., "Mechanical characterization of a dielectric elastomer microactuator with ion-implanted electrodes", Sensors and Actuators, A, vol. 144, No. 1, Jan. 14, 2008, pp. 185-193.

Gerratt et al., "Dielectric breakdown of PDMS thin films", Journal of Micromech and Microengineering, Technical Note, vol. 23, No. 6, Article 067001, Apr. 26, 2013, pp. 1-7.

Hunt et al., "A self-healing dielectric elastomer actuator", Applied Physics Letters, vol. 104, Article 113701, Mar. 19, 2014, pp. 1-3.

(56) References Cited

OTHER PUBLICATIONS

Skov et al., "Optimization Techniques for Improving the Performance of Silicone-Based Dielectric Elastomers", Advances Engineering Materials, vol. 20, No. 5, Article 1700762, Nov. 27, 2017, pp. 1-21.
Mazurek et al., "Glycerol as high-permittivity liquid filler in dielectric silicone elastomer", Journal of Applied Polymer Science, vol. 133, No. 43, Article 44153, Jul. 20, 2016, pp. 1-8.
Rao et al., "Synthesis of flexible silica aerogels using methyltrimethoxysilane (MTMS) precursor", Journal of Colloid and Interface Science, vol. 300, No. 1, Aug. 1, 2006, pp. 279-285.
Seo et al., "Reticulated Nanoporous Polymers by Controlled Polymerization-Induced Microphase Separation", Science, vol. 336, Jun. 15, 2012, pp. 1422-1425.
Jennings, S.G., "The Mean Free Path in Air", J. Aerosol Sci., vol. 19, No. 2, Apr. 2, 1988, pp. 159-166.
Gupta et al., "Nanoemulsions: Formation, Properties, and Applications", Soft Matter, vol. 12, No. 11, Feb. 23, 2016, pp. 1-17.
Helgeson et al., "Mesoporous organohydrogels from thermogelling photocrosslinkable nanoemulsions", Nature Materials, vol. 11, Feb. 12, 2012, pp. 1-9.
Guha et al., "Creating nanoscale emulsions using condensation", Nature Communications, vol. 8, Article 1371, Nov. 8, 2017, pp. 1-7.
Meier et al., "Microemulsion elastomers", Colloid and Polymer Science, vol. 274, Mar. 1, 1996, pp. 218-226.
Richter et al., "Design considerations of form birefringent microstructures", Applied Optics, vol. 34, No. 14, May 10, 1995, pp. 2421-2429.
Mahadik et al., "Elastic and Superhydrophobic Monolithic Methyltrimethoxysilane-based Silica Aerogels by Two-step Sol-gel Process", J. Microelectron, and Packaging Soc., vol. 23, No. 1, Mar. 30, 2016, pp. 35-39.
Jeon et al., "Three dimensional nanoporous density graded materials formed by optical exposures through conformable phase masks", Applied Physics Letters, vol. 89, Article 253101, Dec. 18, 2006, pp. 1-3.
Sultan et al., "Electrical Breakdown Testing of Materials Intended for use in PV Modules", 3rd Atlas/NIST Workshop on Photovoltaics, Dec. 8-9, 2015, 29 pages.
Sekitani et al., "Stretchable active-matrix organic light-emitting diode display using printable elastic conductors", Nature Materials, vol. 8, May 10, 2009, pp. 494-499.
Someya et al., "Conformable, flexible, large-area networks of pressure and thermal sensors with organic transistor active matrixes", PNAS, vol. 102, No. 35, Aug. 30, 2005, pp. 12321-12325.
Wegener et al., "Controlled inflation of voids in cellular polymer ferroelectrets: Optimizing electromechanical transducer properties", Applies Physics Letters, vol. 84, No. 3, Jan. 19, 2004, pp. 392-394.
Wu et al., "Fabrication of ultralong perovskite structure nanotubes", RSC Advances, vol. 8, Jan. 2, 2018, pp. 367-373.
Wu et al., "Efficient multi-barrier thin film encapsulation of OLED using alternating Al2O3 and polymer layers", RSC Advances, vol. 8, Feb. 2, 2018, pp. 5721-5727.
Yang et al., "Harnessing Surface Wrinkle Patterns in Soft Matter", Advanced Functional Materials, vol. 20, Jul. 29, 2010, pp. 2550-2564.
Zhang et al., "Highly Porous Polyhedral Silsesquioxane Polymers. Synthesis and Characterization", J. Am. Chem. Soc ., vol. 120, Aug. 11, 1998, pp. 8380-8391.
Yang et al., "Avoiding the pull-in instability of a dielectric elastomer film and the potential for increased actuation and energy harvesting", Soft Matter, vol. 13, Jan. 6, 2017, pp. 4552-4558.
Wu et al., "3D Printed Silicones with Shape Memory", Scientific Reports, vol. 7, Article 4664, Jul. 5, 2017, pp. 1-6.
Jang et al., "Mechanically Tunable Three-Dimensional Elastomeric Network/Air Structures via Interference Lithography", Nano Letters, vol. 6, No. 4, Mar. 15, 2006, pp. 740-743.
Rogers et al., "Materials and Mechanics for Stretchable Electronics", Science, vol. 327, Mar. 26, 2010, pp. 1603-1607.
Wolak et al., "Dielectric response of structured multilayered polymer films fabricated by forced assembly", Applied Physics Letters, vol. 92, Article 113301, Mar. 17, 2008, pp. 1-3.
Mackey et al., "Enhanced breakdown strength of multilayered films fabricated by forced assembly microlayer coextrusion", Journal of Physics D: Applied Physics, vol. 42, Article 175304, Aug. 12, 2009, pp. 1-12.
Ieda, Masayuki, "Dielectric Breakdown Process of Polymers", IEEE Transactions on Electrical Insulation, vol. El-15, No. 3, Jun. 1980, pp. 206-224.
Matyka et al., "How to Calculate Tortuosity Easily", AIP Conference Proceedings, vol. 1453, May 14, 2012, 6 pages.
Fratzl et al., "The mechanics of tessellations—bioinspired strategies for fracture resistance", Chem Soc Rev., vol. 15, No. 2, Jan. 21, 2016, pp. 252-267.
Cameron et al., "Linear actuation in coextruded dielectric elastomer tubes", ScienceDirect, Sensors and Actuators A: Physical, vol. 147, Issue 1, Sep. 15, 2008, pp. 286-291.
Sole et al., "Nano-emulsions prepared by the phase inversion composition method: Preparation variables and scale up", ScienceDirect, Journal of Colloid and Interface Science, vol. 344, Issue 2, Apr. 15, 2010, pp. 417-423.
Cheng et al., "Controlled In Situ Nanocavitation in Polymeric Materials", Advanced Materials, vol. 23, Issue 3, Jan. 18, 2011, pp. 409-413.
Solans et al., "Nano-emulsions: Formation by low-energy methods", ScienceDirect, Current Opinion in Colloid & Interface Science, vol. 17, No. 5, Oct. 1, 2012, pp. 246-254.
Gohtani et al., "Nano-Emulsions; Emulsification Using Low Energy Methods", Japan Journal of Food Engineering, vol. 15, No. 3, Sep. 1, 2014, pp. 119-130.
Michler et al., "The physics and micro-mechanics of nano-voids and nano-particles in polymer combinations", ScienceDirect, Polymer, vol. 54, No. 13, Jun. 7, 2013, pp. 1-14.
Notice of Allowance received for U.S. Appl. No. 16/703,291 dated Jun. 3, 2021, 61 pages.
Final Office Action received for U.S. Appl. No. 16/262,433 dated May 25, 2021, 30 pages.
Wilson et al., "Variable Wave Plate via Tunable Form-Birefringent Structures", Journal of Microelectromechanical Systems, vol. 17, No. 4, Aug. 2008, pp. 1039-1046.
International Preliminary Report on Patentability received for PCT Application Serial No. PCT/US2019/064395 dated Jun. 24, 2021, 10 pages.
International Preliminary Report on Patentability received for PCT Application Serial No. PCT/US2019/064367 dated Jun. 24, 2021, 10 pages.
Notice of Allowance received for U.S. Appl. No. 16/364,977 dated Feb. 2, 2021, 40 pages.
Notice of Allowance received for U.S. Appl. No. 16/263,829 dated Feb. 4, 2021, 27 pages.
Notice of Allowance received for U.S. Appl. No. 16/449,964 dated Mar. 4, 2021, 21 pages.
First Action Interview received for U.S. Appl. No. 16/262,433 dated Mar. 1, 2021, 12 pages.
Notice of Allowance received for U.S. Appl. No. 16/262,439 dated Apr. 6, 2021, 38 pages.
Notice of Allowance received for U.S. Appl. No. 16/351,477 dated Mar. 29, 2021, 28 pages.
Non-Final Office Action received for U.S. Appl. No. 16/351,477 dated Jun. 23, 2020, 27 pages.
Moore, Duncan T., "Gradient Index Optics", Optical Elements, IVPV Handbook of Optics, 2nd Edition, vol. II—Devices, Measurements, and Properties, 1995, pp. 9.1-9.10.
Nguyen et al., "Synthesis, Processing, and Characterization of Inorganic-Organic Hybrid Cross-Linked Silica, Organic Polyimide, and Inorganic Aluminosilicate Aerogels", National Aeronautics and Space Administration STI Program, NASA/CR-2014-218328, Jul. 2014, 58 pages.
Shatz, Narkis, "Gradient-Index Optics", Science Applications International Corp , Final Report, Mar. 31, 2010, 103 pages.
Teichman et al., "Gradient Index Optics at DARPA", Institute for Defense Analyses, IDA Document D-5027, Nov. 2013, 69 pages.

(56) References Cited

OTHER PUBLICATIONS

Tanaka et al., "Polymer Nanocomposites as Dielectrics and Electrical Insulation-perspectives for Processing Technologies, Material Characterization and Future Applications", IEEE Transactions on Dielectrics and Electrical Insulation, vol. 11, No. 5, Oct. 2004, pp. 763-784.
Fuse et al., "Possible Mechanism of Superior Partial-Discharge Resistance of Polyamide Nanocomposites", Annual Report Conference on Electrical Insulation and Dielectric Phenomena, 2004, pp. 322-325.
Johnson et al., "A brief review of atomic layer deposition:from fundamentals to applications", Materials Today, vol. 17, No. 5, Jun. 2014, pp. 236-246.
Camino et al., "Polydimethylsiloxane thermal degradation Part 1. Kinetic aspects", Polymer, vol. 42, 2001, pp. 2395-2402.
Tanaka et al., "Proposal of a Multi-core Model for Polymer Nanocomposite Dielectrics", IEEE Transactions on Dielectrics and Electrical Insulation, vol. 12, No. 4, Aug. 2005, pp. 669-681.
Loiko et al., "Experimental results and theoretical model to describe angular dependence of light scattering by monolayer of nematic droplets", Journal of Quantitative Spectroscopy and Radiative Transfer, vol. 178, Jul. 2016, 11 pages.
Waldem et al., "Digilens Switchable Bragg grating waveguide optics for augmented reality applications", Proc. SPIE 10676, Digital optics for Immersive Displays, May 21, 2018, 1 page.
Diest et al., "Nanovoided Tunable Optics", U.S. Appl. No. 16/262,439, filed Jan. 30, 2019, 57 pages.
Ouderkirk et al., "Nanovoided Graded-Index Optical Elements, Optical Arrays, and Methods of Forming the Same", U.S. Appl. No. 16/426,737, filed May 30, 2019, 113 pages.
Diest et al., "Polymer Materials Including Coated Nanovoids and Methods and Systems for Forming the Same", U.S. Appl. No. 16/512,335, filed Jul. 15, 2019, 133 pages.
Sharma et al., "Switchable Electroactive Devices for Head-Mounted Displays", U.S. Appl. No. 16/351,477, filed Mar. 12, 2019, 108 pages.
Spann et al., "Nanovoided Polymers Having Shaped Voids", U.S. Appl. No. 16/703,674, filed Dec. 4, 2019, 149 pages.
Landig et al., "Planarization Layers for Nanovoided Polymers", U.S. Appl. No. 16/364,977, filed Mar. 26, 2019, 125 pages.
Ouderkirk et al., "Waveguide with Switchable Input", U.S. Appl. No. 16/263,829, filed Jan. 31, 2019, 55 pages.
Landig et al., "Multiple Layers Between Electrodes Including Nanovoided Polymer", U.S. Appl. No. 16/386,232, filed Apr. 16, 2019, 126 pages.
Landig et al., "Nanovoided Polymers Using Phase Inversion", U.S. Appl. No. 16/449,964, filed Jun. 24, 2019, 139 pages.
Spann et al., "Reduced Hysteresis and Reduced Creep in Nanovoided Polymer Devices", U.S. Appl. No. 16/703,291, filed Dec. 4, 2019, 152 pages.
Diest et al., "Nanovoided Tunable Birefringence", U.S. Appl. No. 16/262,433, filed Jan. 30, 2019, 51 pages.
Malhotra et al., "Spatially Addressable Nanovoided Polymers", U.S. Appl. No. 16/417,911, filed May 21, 2019, 138 pages.
International Search Report and Written Opinion received for PCT Application Serial No. PCT/US2019/064395 dated Mar. 12, 2020, 17 pages.

Si et al., "Liquid-Crystal-Enabled Active Plasmonics: A Review", Materials, vol. 7, No. 2, Feb. 18, 2014, pp. 1296-1317.
Crawford, Gregory P., "Electrically Switchable BRAGG GRATINGS", Optics & Photonics News, Apr. 30, 2003, pp. 54-59.
Dickson et al., "Electronically Controlled Surface Plasmon Dispersion and Optical Transmission through Metallic Hole Arrays Using Liquid Crystal", Nano Letters, vol. 8, No. 1, Jan. 1, 2008, pp. 281-286.
International Search Report and Written Opinion received for PCT Application Serial No. PCT/US2019/064367 dated Mar. 11, 2020, 17 pages.
Non-Final Office Action received for U.S. Appl. No. 16/364,977 dated Oct. 19, 2020, 38 pages.
Correa D.M., et al., "Negative Stiff less Honeycombs for Recoverable Shock Isolation," Rapid Prototyping Journal, 2015, vol. 21 (2), pp. 702-713.
Shen J., et al., "Simple Cubic Three-Dimensional Auxetic Metamaterials," Physica Status Solidi (B), Jul. 17, 2014, vol. 251 (8), pp. 1515-1522.
Preinterview first office action received for U.S. Appl. No. 16/262,433 dated Oct. 26, 2020, 58 pages.
Preinterview first office action received for U.S. Appl. No. 16/262,439 dated Nov. 30, 2020, 42 pages.
Final office action received for U.S. Appl. No. 16/351,477 dated Dec. 1, 2020, 38 pages.
Preinterview first office action received for U.S. Appl. No. 16/263,829 dated Dec. 22, 2020, 36 pages.
Non-Final office action received for U.S. Appl. No. 16/449,964 dated Nov. 24, 2020, 91 pages.
Holda et al., "Understanding and guiding the phase inversion process for synthesis of solvent resistant nanofiltration membranes", J. Appl. Polym. Sci. 42130, 2015, 17 pages.
Struzynska-Piron et al., "Synthesis of solvent stable polymeric membranes via UV depth-curing", Chem. Commun., vol. 49, 11494, 2013, 3 pages.
Zhu et al., "Large deformation and electromechanical instability of a dielectric elastomer tube actuator", Journal of Applied Physics, vol. 108, Issue 7, Article 074113, Oct. 13, 2010, pp. 1-6.
Catmull et al., "Recursively generated B-spline surfaces on arbitrary topological meshes", Computer-Aided Design, vol. 10, No. 6, Nov. 1, 1978, pp. 183-188.
Loop, Charles Teorell, "Smooth Subdivision Surfaces Based on Triangles", Thesis, Master of Science, University of Utah, Aug. 1, 1987, 74 pages.
Merkel et al., "Gas Sorption, Diffusion, and Permeation in Poly(dimethylsiloxane)", Journal of Polymer Science: Part B: Polymer Physics, vol. 38, Feb. 1, 2000, pp. 415-434.
Kim et al., "Mathematical analysis of oxygen transfer through polydimethylsiloxane membrane between double layers of cell culture channel and gas chamber in microfluidic oxygenator", Microfluidics and Nanofluidics, vol. 15, Feb. 1, 2013, 39 pages.
Cruz-Hernandez et al., "Phase Control Approach to Hysteresis Reduction", IEEE Transactions on Control Systems Technology, vol. 9, No. 1, Jan. 1, 2001, pp. 17-26.
Zuev, Yu.S., "Elastomer-gas systems", International Polymer Science and Technology, vol. 28, No. 2, Feb. 1, 2001, pp. 43-53.
Shir, Daniel Jay-Lee et, "Three-Dimensional Nanofabrication with Elastomeric Phase Masks", PhD Thesis, University of Illinois at Urbana-Champaign, Oct. 17, 2007, 138 pages.

\* cited by examiner

FABRICATION OF SHAPED VOIDS

CROSS REFERENCE TO RELATED APPLICATION

This application claims the benefit of U.S. Provisional Application No. 62/777,825, filed Dec. 11, 2018, the disclosure of which is incorporated, in its entirety, by this reference.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
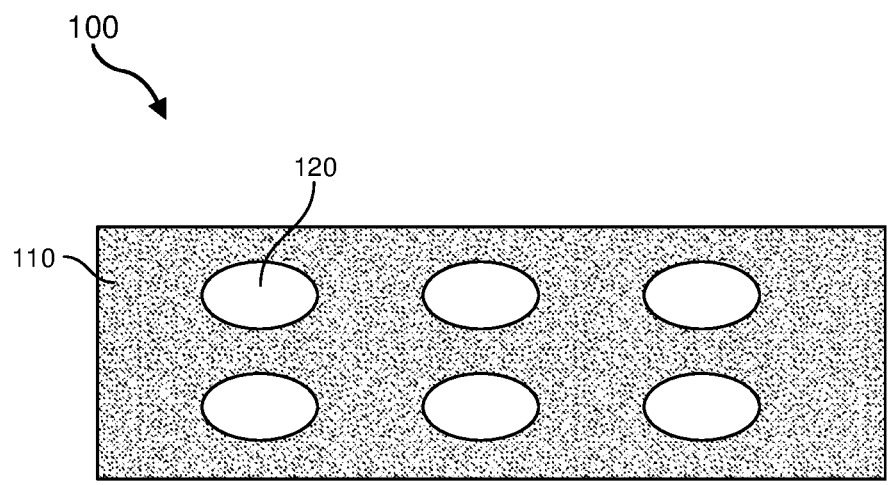
FIG. 1 shows a voided polymer material including a periodic array of voids.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

Polymer materials may be incorporated into a variety of different optic and electro-optic architectures, including active and passive optics and electroactive devices. Electroactive polymer (EAP) materials, for instance, may change their shape under the influence of an electric field. EAP materials have been investigated for use in various technologies, including actuation, sensing, and/or energy harvesting. Lightweight and conformable, electroactive polymers may be incorporated into wearable devices (such as haptic devices) and are attractive candidates for emerging technologies, including virtual reality/augmented reality devices where a comfortable, adjustable form factor is desired.

Virtual reality (VR) and augmented reality (AR) eyewear devices or headsets, for instance, may enable users to experience events, such as interactions with people in a computer-generated simulation of a three-dimensional world or viewing data superimposed on a real-world view. VR/AR eyewear devices and headsets may also be used for purposes other than recreation. For example, governments may use such devices for military training, medical professionals may use such devices to simulate surgery, and engineers may use such devices as design visualization aids.

These and other applications may leverage one or more characteristics of thin film polymer materials, including their electrical, mechanical, and/or optical properties. There is a need, for example, for improved actuators, sensors, and optical elements, along with associated methods for applications in AR and VR devices.

The present disclosure is generally directed to, for example, nanovoided polymers (NVP), electroactive NVP elements, methods of preparing NVP elements, and apparatuses, methods, and systems including electroactive materials, such as NVP elements. Embodiments of the instant disclosure may include voided polymers, such as nanovoided polymers, layers thereof, electroactive and/or sensor elements including such nanovoided polymers, applications of nanovoided polymers in devices such as actuators, optical elements (which may include actuators), sensors, and combinations thereof, methods of fabrication of any of the above, and methods of operating any such device.

In some examples described herein, the term voided polymer may refer to a material including a polymer matrix and including voids within the polymer matrix. In some examples, the term "void" may refer to a volume of fluid material within the polymer matrix. For example, a void may include a gas (such as air, nitrogen, an inert gas, or the like), a liquid, or other fluid medium. Voids may include nanovoids, which may include voids having at least one interior dimension (such as a diameter or other analogous interior dimension) that is less than approximately 1 micron. A polymer matrix may include one or more polymer components, and may include other non-polymer components, such as nanoparticles and the like.

As will be described in greater detail below, examples of the instant disclosure include electroactive devices, such as NVP elements, actuators, sensors, and optical elements, having, for example, improved electrical and/or mechanical properties, such as improved electrical control of actuation and/or improved spatial resolution of sensing. Features from any of the embodiments described herein may be used in combination with one another in accordance with the general principles described herein.

In some examples, a method of fabricating a nanovoided polymer includes depositing a precursor composition onto a substrate. The substrate may include one or more components and/or layers subsequently used in a device, such as a polymer layer, electrode, or similar. In some examples, the fabricated nanovoided polymer may be released from the substrate before further processing. The precursor composition may include at least one polymerizable species, such as one or more monomer molecular species, or one or more oligomer molecular species. The precursor composition may also include a liquid in which the monomer dissolves and/or a liquid immiscible with the monomer (or which does not dissolve the monomer, for example, if the monomer is solid, and which in some examples may not mix with any solvent used to dissolve the monomer). In some examples described herein, a polymerizable species may be referred to as a monomer for conciseness, though examples are not limited to the use of monomers, as other polymerizable species may be used, such as oligomers. In some examples, the term oligomers may include dimers, trimers, and the like.

Figure 14:
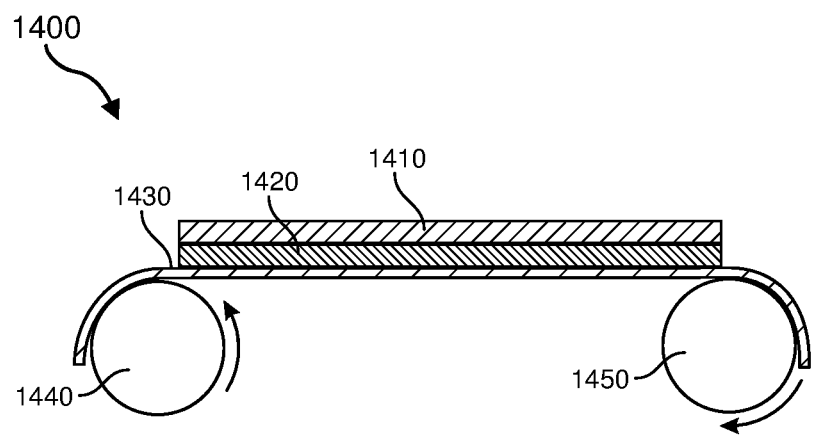
FIG. 14 shows a cross-section of a material layer formed on a substrate.
Figure 15:
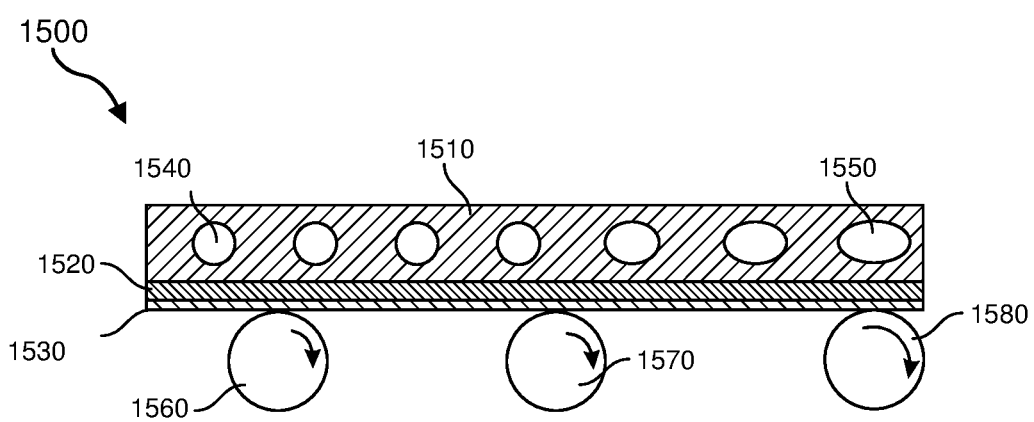
FIG. 15 shows a cross-section of a material layer formed on a substrate supported by a conveyor belt.
Figure 17:
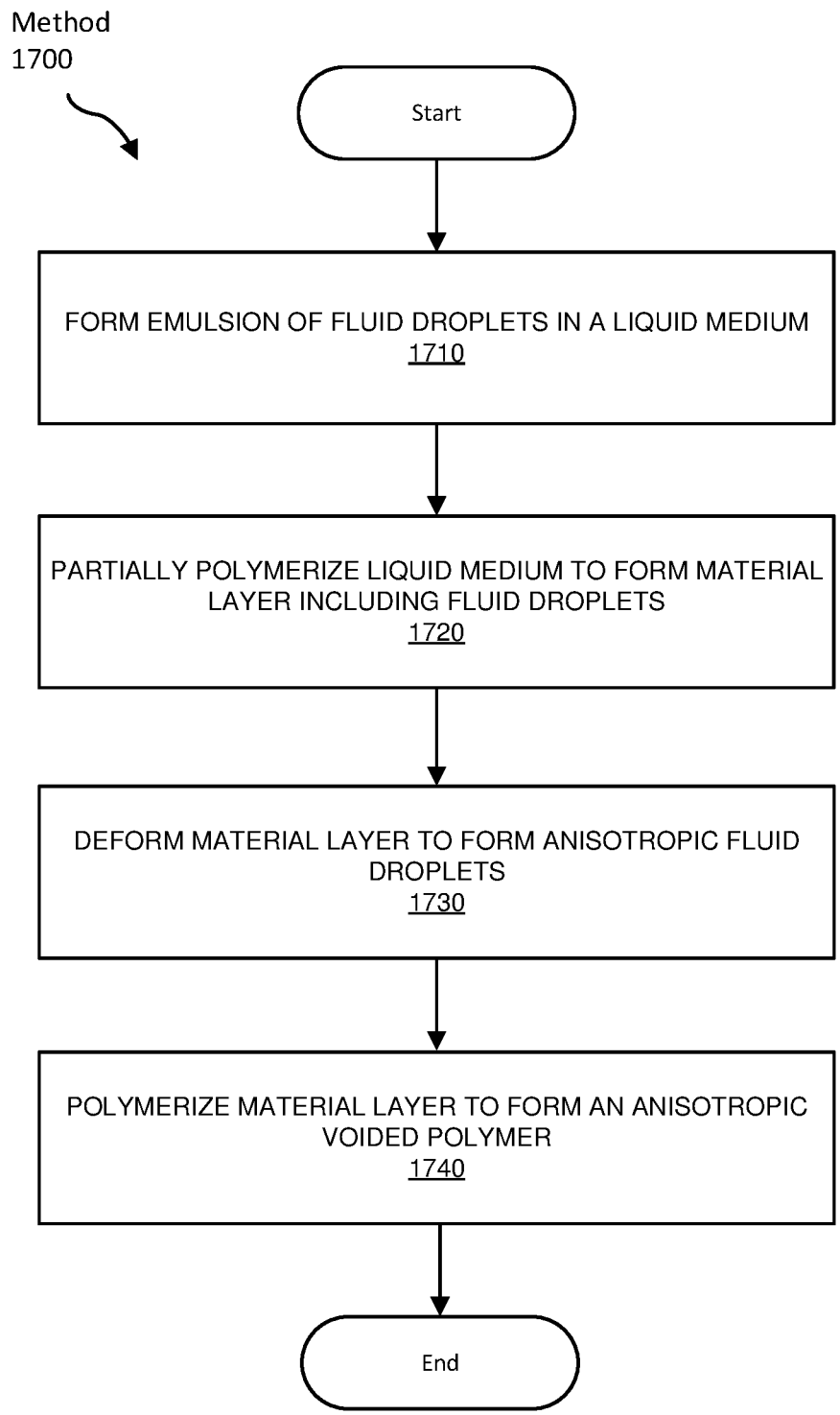
FIGS. 17 and 18 illustrate example methods of forming a voided polymer material.
Figure 18:
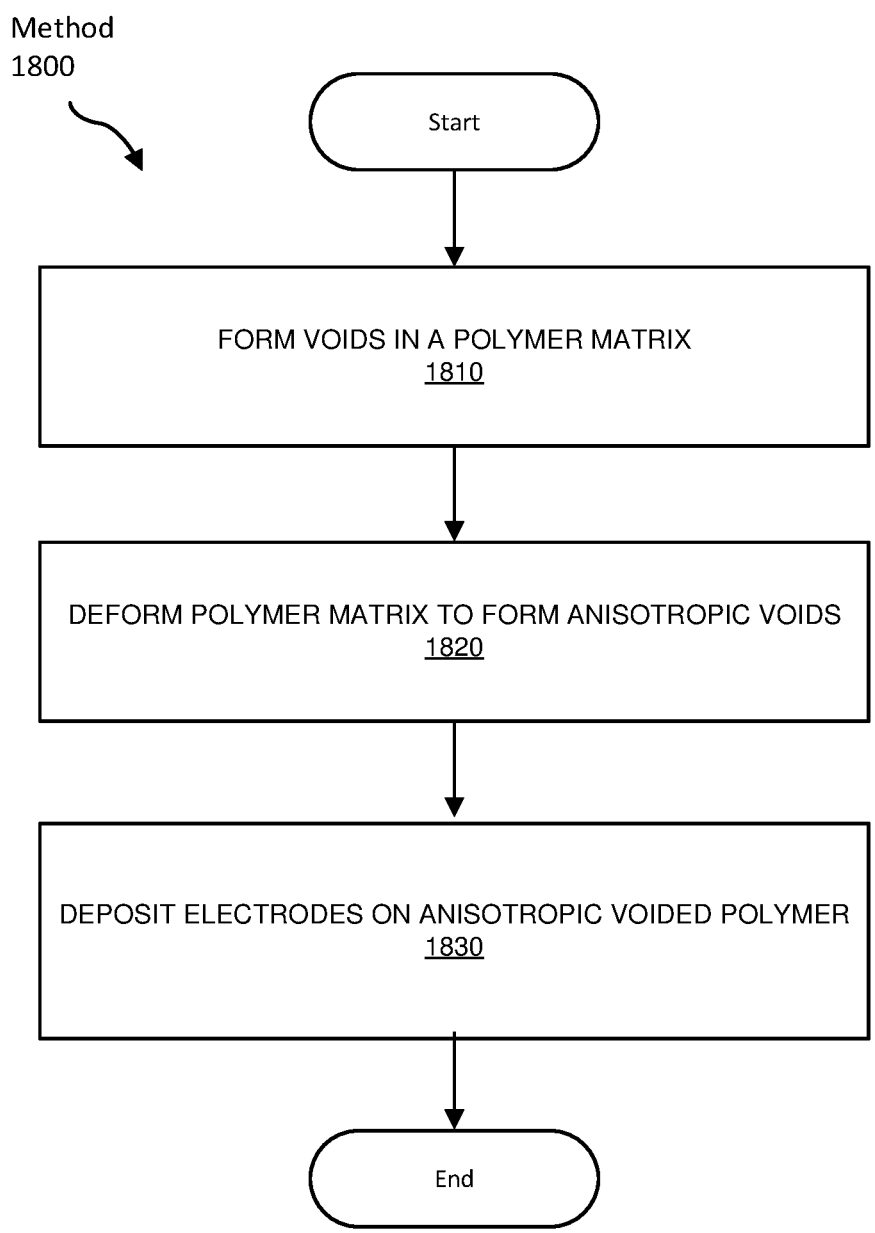
Figure 19:
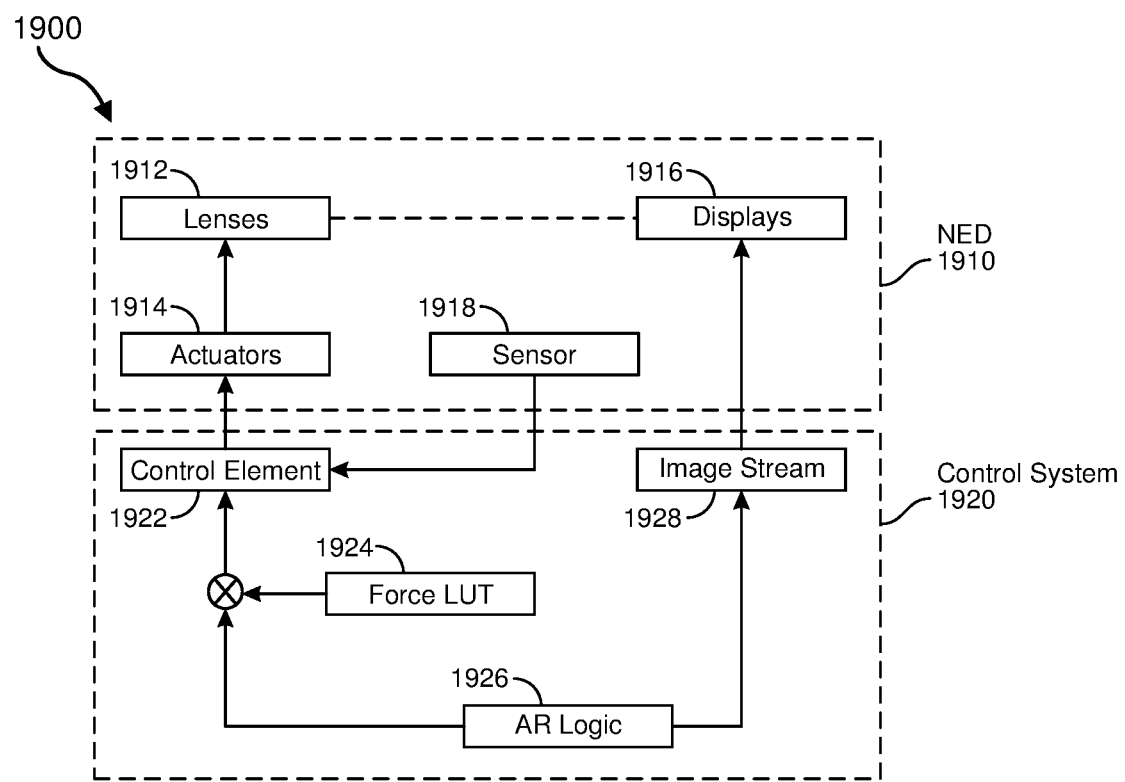
FIG. 19 illustrates an example control system.

The following will provide, with reference to FIGS. 1-24, detailed descriptions of, for example, voided polymer films, their preparation, and applications. FIG. 1 shows a voided polymer material including anisotropic voids. FIGS. 2-5 and 9 show an apparatus configured to stretch a material layer along one direction to form a material layer having anisotropic voids. FIGS. 6-8 and 10 show an apparatus configured to stretch a material layer along two directions to form a material layer including anisotropic voids. FIGS. 11, 12A, 12B, 13A, and 13B show formation of anisotropic voids using, for example, pressure, a pressure chamber, or application of an external field. FIGS. 14 and 15 further illustrate an example approach to stretching a material layer. FIG. 16 shows the formation of anisotropic voids using solvent evaporation. FIGS. 17-18 illustrate example methods. FIG. 19 shows an example system. FIGS. 20-24 illustrate example augmented reality and/or virtual reality devices, which may in some examples include haptic elements.

Nanovoided polymers represent a new class of materials, where, for example, a bulk polymer matrix may include gas-filled voids, such as nanovoids having an average diameter between approximately 10 nm and approximately 1000 nm. The introduction of nanovoids into the bulk polymer film provides an added degree of tunability in terms of overall macroscopic properties, including electrical, mechanical, thermal, diffusive, and/or chemical properties.

Voids may be formed in a material from the inclusion of a fluid (such as a gas or liquid) in the matrix, and the fluid may naturally form spherical shapes (e.g., spherical droplets) to minimize surface energy. A material including spherical droplets may be used to form a voided polymer (e.g., a nanovoided polymer) including spherical voids. However, there is a need for methods of forming voided polymers including anisotropic voids. Anisotropic voids in polymers may provide material that are favorable for various applications, for example, where the material is compressed, and may also modify how the material interacts with light.

In some examples, a method of fabricating an anisotropic voided polymer (such as an anisotropic NVP) includes depositing a nanovoided polymer, or a material layer including a polymer precursor, using a deposition process.

Examples described herein may refer to nanovoided polymers, but examples may also include voided polymers. A deposition process may include one or more of the following: spin coating, printing, chemical vapor deposition, vapor coating, transfer of a prefabricated polymer layer, dipping, or spraying, or extrusion. The method may further include partial polymerization of the material (e.g., precuring) to a certain degree via polymerization, cross-linking, curing, or some other process using a source of actinic radiation. The method may further include deforming the nanovoided polymer element (or a material layer that provides an NVP precursor) to form the anisotropic nanovoided polymer element by at least one of the following methods: stretching or tensioning (e.g., using an extrusion process); stretching or tensioning a substrate on which the nanovoided polymer material is deposited; pressing the material; deforming a fluid-based phase (such as emulsions or lyotropic phases) by varying chemical composition, temperature, salt or other component concentration, flow rate, shear rate, agitation, external fields (such as ultrasound, electrical, electromagnetic fields such as optical or UV, or magnetic fields); using shaped nanoparticles that may later be removed (e.g., shaped sacrificial particles); using spherical particles that may be reshaped using temperature or pressure or mechanical stretching/tensioning or a combination thereof, where the particles may include solid polymer nanospheres that may later be removed, and/or where the particles include gas-filled polymer nanospheres that may either later be removed or left within the material.

In some examples, the anisotropy of the voids may be formed by a process including heating the material prior to and/or during stretching or tensioning. In some examples, the formation of anisotropic voids includes irradiation of the material using one or more radiation sources, such as curing sources, such as UV and/or visible radiation sources.

In some examples, after the anisotropy of the voids is formed, the anisotropy may be "locked in" by one or more further processes, such as a process including further (e.g., complete) polymerization, cross-linking, curing, or some other process. In some examples, "locking in" of void anisotropy may include rendering the void anisotropy substantially permanent, for example, after removing an external factor that induces the void anisotropy. Examples may include irradiating the material layer using UV or visible light, for example, using a source of actinic radiation.

In some examples, a NVP element includes shaped voids, for example, voids having a shape that is changed from the original form of the void when the void was formed. In some examples, after the deformation of the original shape, the aspect ratio of the shaped void may be about 1.5X (alternatively about 2X, alternatively about 3X, alternatively about 5X the original aspect ratio of the emulsion).

In some examples, an anisotropic nanovoided polymer includes a bulk polymer including an arrangement of nanoscale gas-filled voids. The shapes of the voids may be anisotropic, or may be a combination of spherical and anisotropic shapes. In some examples, void shape may vary throughout the material.

In some examples, the deposited material may include one or more of the following: a monomer, polymer, solvent, porogen, surfactant, or emulsifier. In some examples, the deposited material may include nanoparticles, such as polymer nanoparticles, such as polymer nanospheres. Nanoparticles may be solid, hollow, or may include different shell and core materials.

Examples include methods of fabricating anisotropic voids in a polymer. In some examples, voids may be extended arbitrarily along a direction, so that the voids are elongated shaped tubes, which may have, for example, an anisotropic or circular cross-section.

In some examples, anisotropic voids can be generated through mechanical deformation of the polymer in one or two directions (e.g., two orthogonal directions). Mechanical deformation may include one or more processes, such as stretching, pressing, or the like. In some examples, the stretching may include a deformation along at least one direction of at least approximately 1.5X, such as at least approximately 2X, for example, at least approximately 3X, for example, at least approximately 5X. In this context, the "X" may refer to, for example, the ratio of a stretched dimension to the original dimensions of the material. A deformation of 2X may correspond to doubling a dimension along an example direction. Stretching in one direction may lead to a certain change (e.g., decrease) in at least one dimension measured along a direction orthogonal to the stretching direction. (e.g., within the plane of a material layer, and/or within the layer thickness). In some examples, the dimensional decrease along a direction orthogonal to the stretching direction may depend on the method used to stretch or otherwise deform the material. In some examples, in which the material may be adhered to a conveyor belt or other substrate, and the conveyor belt or other substrate is stretched, a dimensional decrease along a direction orthogonal to the stretching direction may be related to the Poisson ratio of the conveyor belt or other substrate. In some examples, in which a material may be stretched directly (e.g., using grippers) the dimensional decrease along a direction orthogonal to the stretching direction may be related to the Poisson ratio of the material, unless, for example, the material is prevented from deforming along an orthogonal direction (e.g., using grippers retaining the material in the orthogonal direction, e.g., within the plane of a layer).

FIG. 1 shows a voided polymer material 100, including a periodic array of anisotropic voids 120 in a polymer matrix 110. In this example, as illustrated, the anisotropic voids 120, shown in cross-section, have an internal horizontal dimension that is appreciably greater than the internal vertical dimension, and hence have appreciable anisotropic shape. In some examples, the voids may have a generally prolate spheroid shape. In some examples, voids may have a generally oblate spheroid shape, or another shape having the illustrated cross-section. In some examples, the voids may include nanovoids having an internal dimension of less than approximately 1 micron.

In some examples, voids, such as nanovoids, may be arranged in a regular array, with periodic variations in one, two, or three orthogonal directions. However, in some examples, there may be little or no regularity to the arrangement of voids in the polymer matrix.

Figure 2:
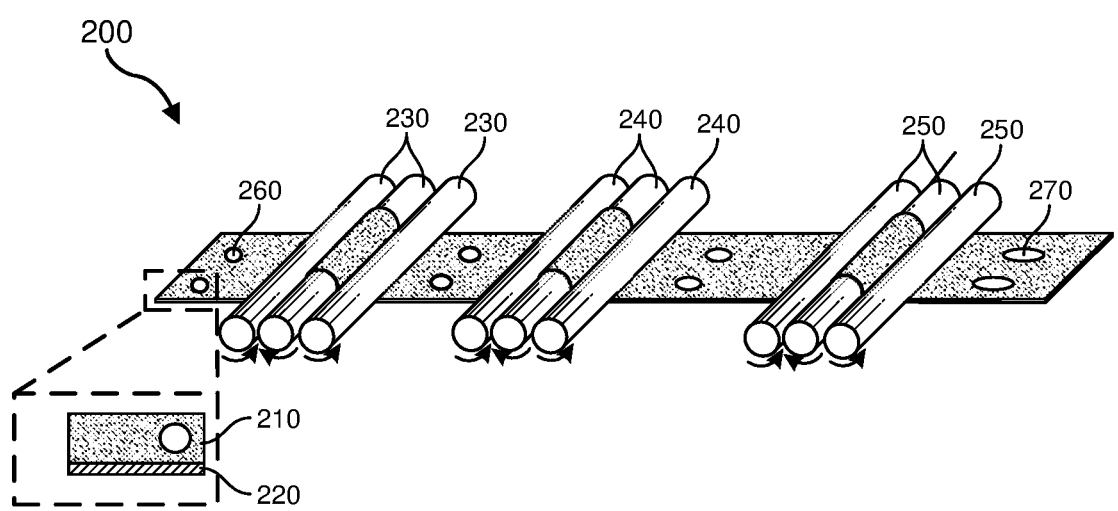
FIG. 2 shows an apparatus configured to stretch a material layer along one direction.

FIG. 2 shows an apparatus 200 configured to stretch a material along one direction. In this example, the material 210 is deposited (e.g., cast, or otherwise formed or placed) onto a conveyor belt 220. The figure shows the material 210 including isotropic (spherical) voids, such as void 260, in the initial material that is input into the apparatus. The conveyor belt then passes through a series of roller assemblies (first, second, and third roller assemblies, 230, 240, and 250 respectively). The rotation speed of consecutive roller assemblies may increase as a material passes through the apparatus. For example, the rotation speed of the third roller assembly 250 may be greater than the rotation speed of the second roller assembly 240, and this may in turn be greater than the rotation speed of the first roller assembly 230. This approach allows the material to be stretched and elongated along the direction of motion of the conveyor belt. In this example, the spherical voids 260 on the input side are stretched into anisotropic voids 270 on the output side of the apparatus. Roller assembly rotation speeds, and/or rotation direction, may be modified to achieve desired degrees of material stretching. In some examples, the anisotropic voids 270 may have a generally elongated (e.g., prolate) shape.

An apparatus such as that shown in FIG. 2 may allow uniaxial stretching of the material. In some examples, the conveyor belt 220 may be flexible. In some examples, the conveyor belt may adhere effectively to the material, to help obtain larger stretch ratios.

In some examples, the thickness and/or the width of the material may reduce as the material is uniaxially stretched along the direction of the conveyor belt.

In some examples, an apparatus may include one or more roller assemblies. In these examples, the material may be fed into the apparatus using any appropriate mechanism, then stretched using one or more roller assemblies. Roller assemblies may each include one or more roller.

Figure 3:
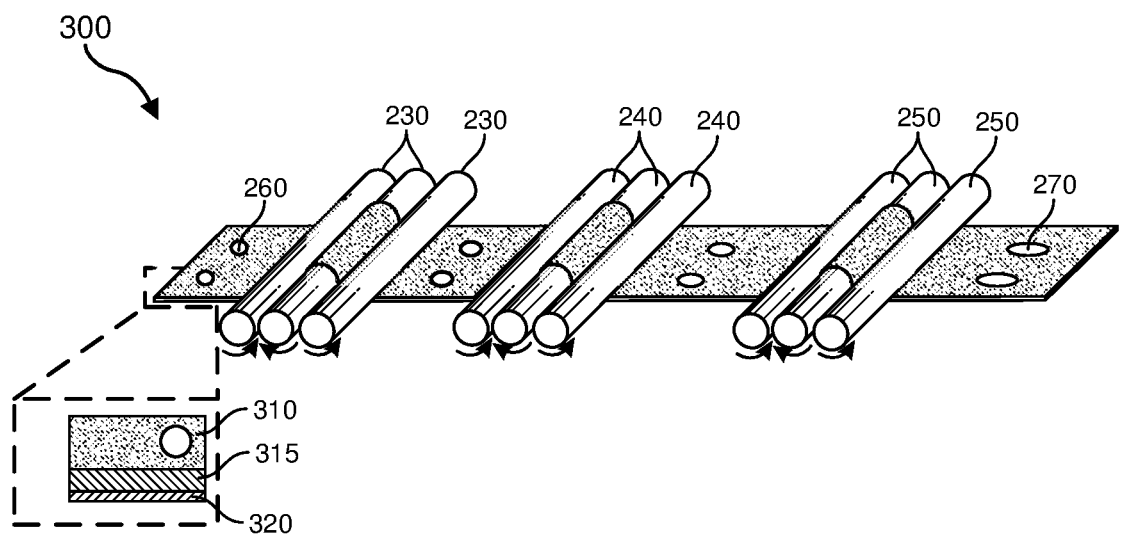
FIG. 3 shows an apparatus configured to stretch a material layer supported by a substrate along one direction.

FIG. 3 shows an apparatus 300 similar to the apparatus 200 shown in FIG. 2, where similar elements may have similar numbers. In this example, the material 310 is deposited (e.g., cast, or otherwise formed or placed) onto an intermediate layer 315, which may be in the form of a thin film, supported by the conveyor belt 320. The intermediate layer 315 may provide surface adhesion to both the conveyor belt 320 and the material 310. An advantage of this approach is that the layer 315 may have reduced mechanical strength, compared with the conveyor belt, and the layer may help adhesion of the material 310 to the conveyor belt.

In some examples, an apparatus may include one or more radiation sources, for example, for polymerization and/or cross-linking of the material. In some examples, a single radiation source may be used (e.g., as a curing source). In some examples, the same radiation source may be used to partially polymerize the polymer film before deforming the material (and the voids in the material), and also to fully polymerize the film after deforming the material. In some examples, initial partial polymerization and complete polymerization may be performed using different radiation sources. Initial partial polymerization can mean that in a system containing more than one monomer, some monomer components are fully polymerized while other monomers are not or only partially polymerized. Radiation sources may include actinic radiation sources (which in some examples may refer to UV-visible radiation sources, configured to provide UV and/or visible radiation).

Any fluid (e.g., one or more solvents) remaining in the voids may be removed after partial polymerization and before deforming the voids, or may be removed after polymerization is complete. A fluid may be removed from the polymer voids using one or more of the following: a change in temperature (e.g., an increase temperature), pressure (e.g., a reduced pressure), a solvent exchange (e.g., introducing a different fluid into the voids with one or more favorable properties), or other process that removes the fluid from the partially or fully cross-linked polymer to produce a voided polymer.

In some examples, heating the polymer film before and/or during mechanical stretching may increase the maximum achievable amount of stretching. In some examples, an elevated temperature may be used to heat a polymer component of the material above the glass transition temperature of the polymer component.

In some examples, a multilayer substrate may be used, for example, including a lower layer that adheres to the rollers, an upper layer that adheres to the material, and optionally other layers (e.g., to provide support, mechanical strength, resiliency, and/or elasticity).

Figure 4:
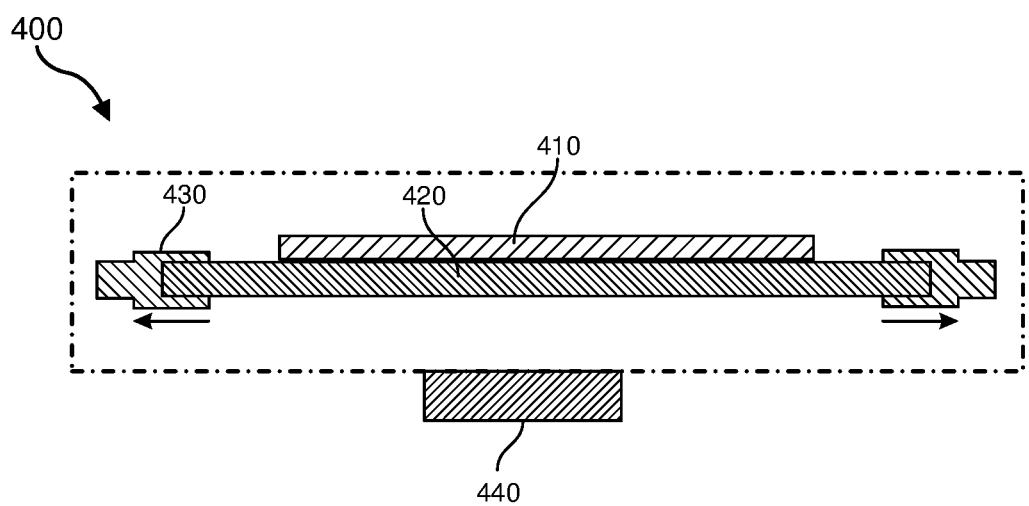
FIG. 4 is a side view that illustrates a material layer stretched transversely.

FIG. 4 is a side view of an example apparatus 400 configured to stretch a material transversely. The material 410 is located (in this example, as a material layer) on a substrate 420, which may be, for example, a layer (e.g., an intermediate layer as discussed in relation to FIG. 3), a combination of a layer and a portion of a conveyor belt, or a portion of a conveyor belt. The substrate 420 may be attached to grippers 430 on two opposite sides of the material 410, and the grippers may be moved in opposite directions, for example, along the same axis, to stretch the substrate 420 and thereby stretch the adhered material 410.

The stretching may be accompanied by heating of the material 410 and/or the substrate 420, for example, using a heating element 440. Other approaches to heating may be used.

Figure 5:
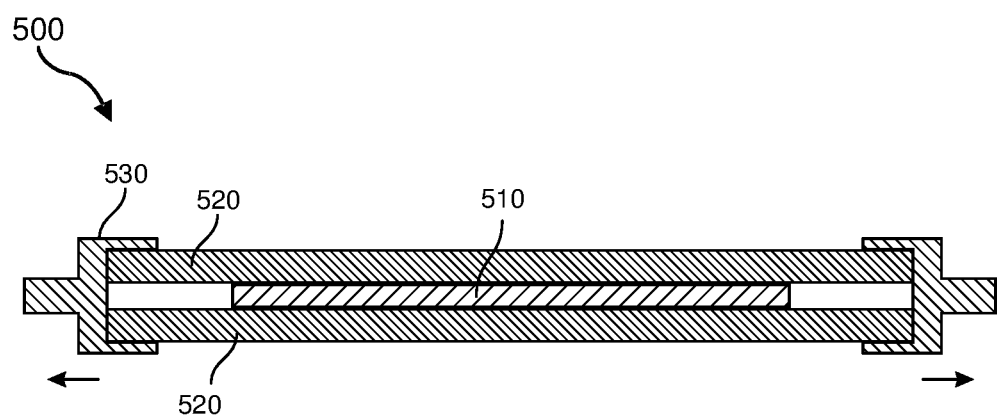
FIG. 5 shows a material layer between a pair of layers, which are then stretched.

FIG. 5 shows an example apparatus 500 in which the material 510 is sandwiched between two substrates 520 and both substrates 520 are pulled apart uniaxially by grippers 530. The substrates 520 may be identical, though this is not limiting. The arrows denote the approximate movement of the grippers 530 apart from each other. In some examples, this may enable a more uniform stretching throughout the material, and, for example, a more uniform distribution of anisotropic voids after stretching.

In some examples, a heating element may be used to heat one or more of the substrates and/or the material. For example, a heating element may include one or more IR sources, which may, for example, be located above and below the substrates. In some examples, the substrates may absorb IR energy and heat up. Heating of the substrates may be used to heat the material. In some examples, the substrates may transmit IR energy to the material, which may then heat up. Example heaters may include electrical heaters, IR LEDs, or other heating devices.

Figure 6:
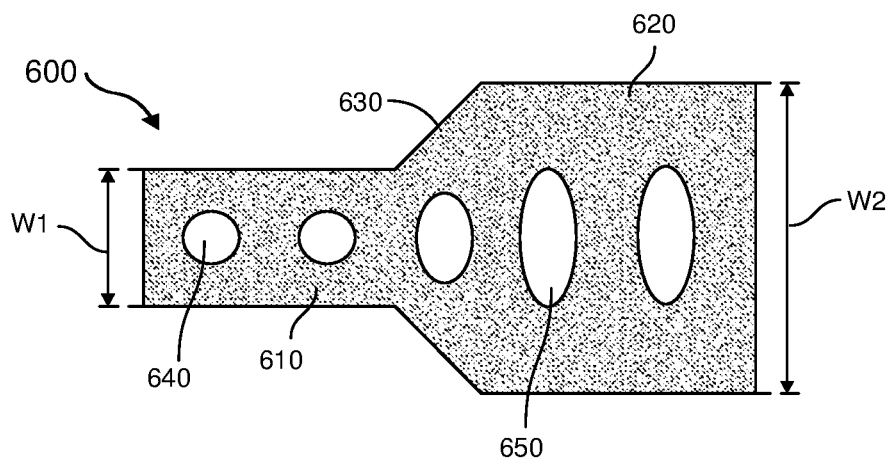
FIG. 6 shows a top view of an example transverse stretcher.

FIG. 6 shows a top view (600) of an example approach to transverse stretching. An input material 610 with an initial transverse width W1 may be received (from the left, as shown) and transported through a uniaxial transverse stretcher, for example, using an approach such as illustrated in FIG. 4 or FIG. 5. In the transverse stretch region 630, one or more grippers may be configured to stretch the film transversely from an initial width W1 to an output width W2. An output material 620 may be output from the transverse stretcher with output width W2.

As illustrated, the input material 610 may include isotropic voids 640, and the output material 620 may include anisotropic voids 650. For transverse stretching, the input material 610 may include generally spherical voids, and the output material 620 may include generally prolate spheroidal voids elongated in the direction of stretching.

Figure 7:
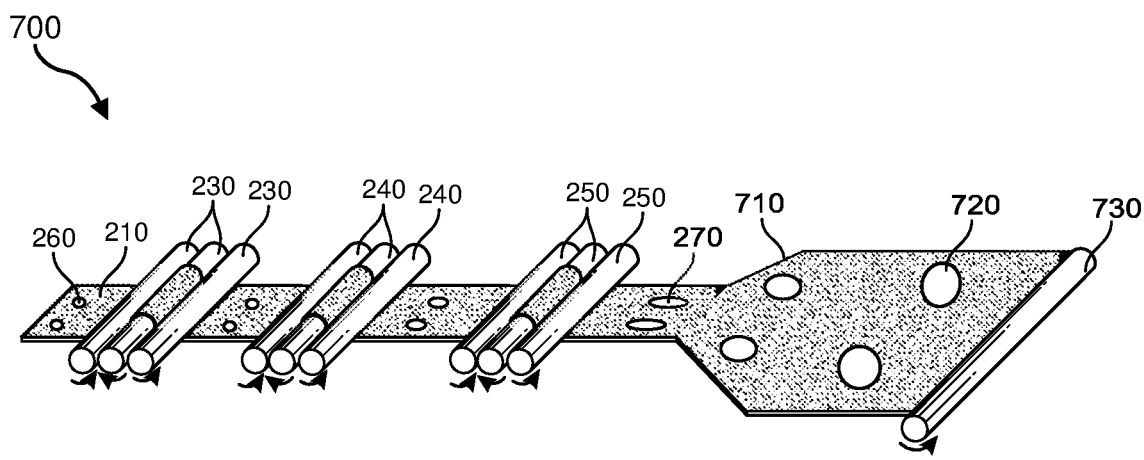
FIG. 7 shows an example of a sequential biaxial stretcher.

FIG. 7 shows an example of a sequential biaxial stretcher 700. The left hand portion may be similar to that shown in FIG. 2, and is similarly labeled. As described above in relation to FIG. 2, the material 210 (including initial voids 260) is transported on a conveyor belt 220 through a series of roller assemblies (230, 240, and 250) that stretch the material 210 in the direction of travel of the conveyor belt. Voids may be deformed from initial voids 260 (e.g., which may have a generally spherical shape) to anisotropic voids 270, for example, as described in relation to FIG. 2. As discussed above, the anisotropic voids 270 may have a generally prolate spheroidal shape, and may have, for example, a generally American football shape. The intermediate anisotropic voids may be elongated (e.g., relative to a generally isotropic shape) in the direction of stretching, which in this example may be generally in the direction of travel of the conveyor belt. In this example, the anisotropic voids 270 are intermediate anisotropic voids, which are then subject to transverse stretching.

FIG. 7 further shows that, in some examples, the uniaxial stretching provided by the roller assemblies may be followed by a transverse stretching of the material in the transverse stretch region 710. The transverse stretching may be along an orthogonal direction to that of the conveyor belt movement, and may be, for example, within the plane of a layer of the material. Transverse stretching may use, for example, grippers as discussed in relation to FIGS. 4-6. The transverse stretching provides anisotropic voids 720. The anisotropic voids 720 may have, for example, a generally oblate spheroidal shape, and may have, for example, a generally pancake-shaped form. The output material is provided by optional roller 730. The material may pass under the roller 730.

Figure 8:
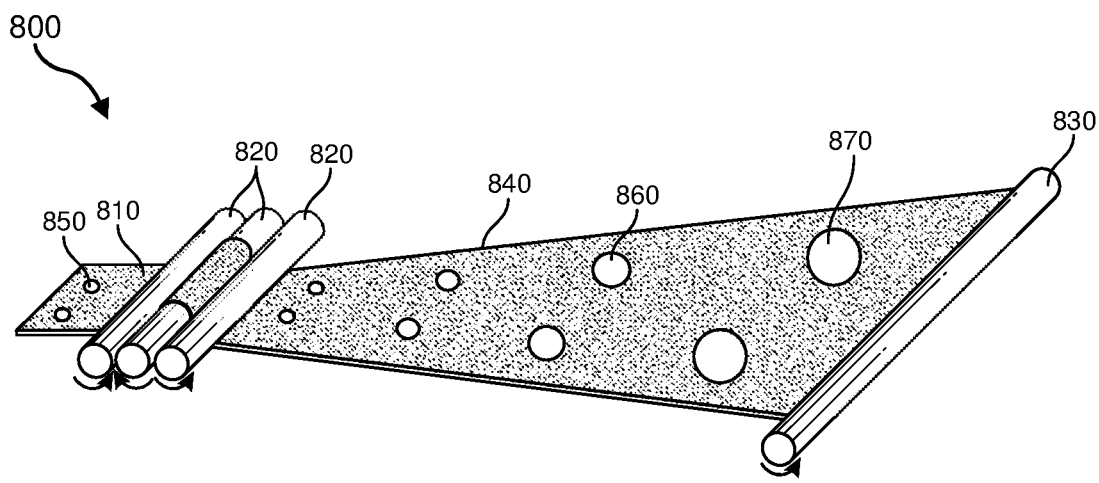
FIG. 8 shows an example of a sequential biaxial stretcher.

FIG. 8 illustrates an example of a biaxial stretcher 800. As described above in relation to FIG. 2, a material may be stretched along the direction of travel by setting the rotation speed of an output roller assembly to be different (e.g., faster) than the input speed of an input roller assembly, or other input mechanism. In this example, a material 810 is input to the biaxial stretcher 800 at a speed determined by the roller speed of the roller assembly 820. Similarly, the rotation speed of the output roller 830 may determine the output speed of the processed material. The material may pass under roller 830 and may then be output from the apparatus 800. Hence, the material 810 may be stretched along the direction of travel of the material by setting the roller speed of the output roller 830 to be faster than that of the roller assembly 820. In some examples, the roller speed may be the speed of a surface of a roller, and may be determined by the angular speed of the roller, and the roller diameter. The material may also be stretched transversally, for example, generally at right angles to the direction of travel, as the material passes through the transverse stretch section 840, using, for example, grippers as described in relation to FIGS. 4-6. In this example, the material has initial voids 850, having an initial void shape, that are stretched into anisotropic voids 870 having an output void shape. The initial void shape may be generally spherical. The output void shape may be generally oblate, for example, flattened in a direction normal to the plane of the conveyor belt. Intermediate anisotropic voids 860, for example, within the transverse stretch region 840, may also have generally oblate spheroidal shapes, but may have a lower anisotropy parameter than the anisotropic voids 870. In some examples, the degree of stretching of the material transverse to the conveyor direction may generally match the degree of stretching along the conveyor direction, though other degrees of stretching may be used.

In some examples, the material may be stretched in two directions simultaneously. For example, in the transverse stretch region 840, the material may be stretched in the direction of the conveyor belt (e.g., if the output roller 830 is faster than the roller assembly 820), and transverse stretching may be obtained using grippers.

Figure 9:
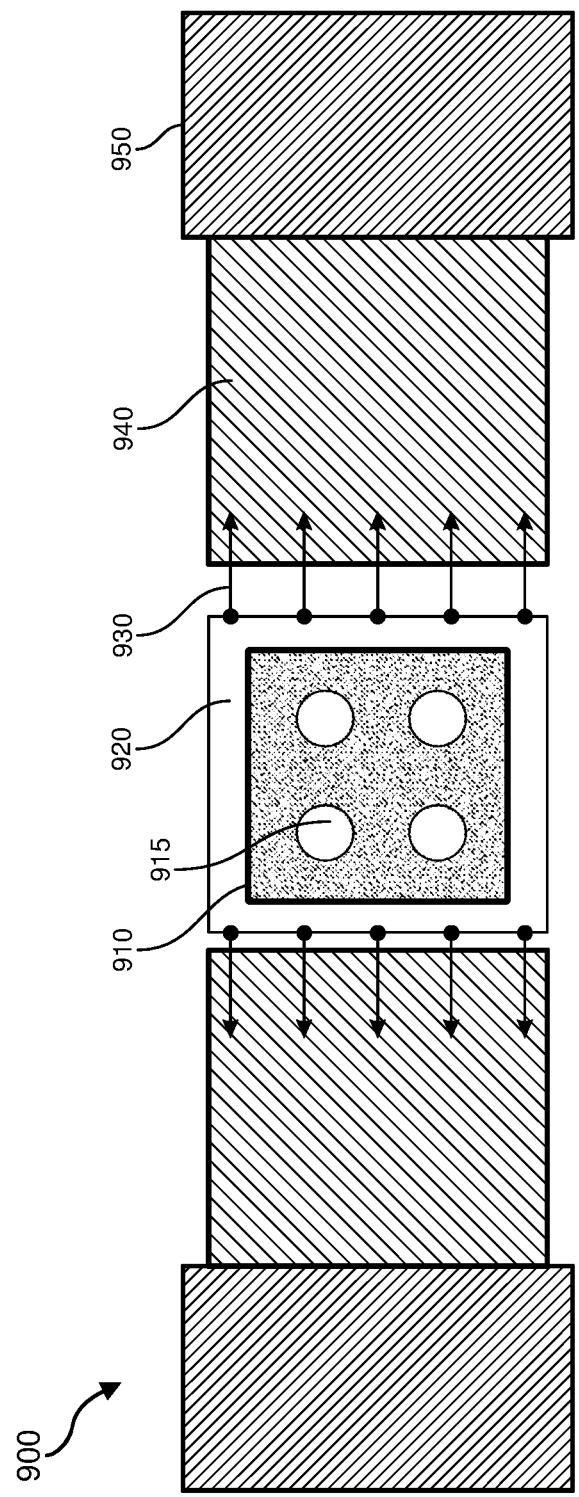
FIG. 9 is a top view of a uniaxial stretcher.

FIG. 9 is a top view of a uniaxial stretcher 900. A material 910 is located on a substrate 920, and the substrate is connected along a pair of opposite, parallel, sides of the substrate to an arrangement of grippers 930. The grippers 930 connect opposed edges of the substrate 920 to a linear arm 940, which may be actuated in a direction orthogonal to the attached side of the material using an actuator 950. The material 910 may include voids 915. These may be initially generally spherical voids, and deformation of the material may deform the initially generally isotropic voids to form anisotropic voids (e.g., a prolate spheroid shape, or other shape elongated in the direction of stretching).

Figure 10:
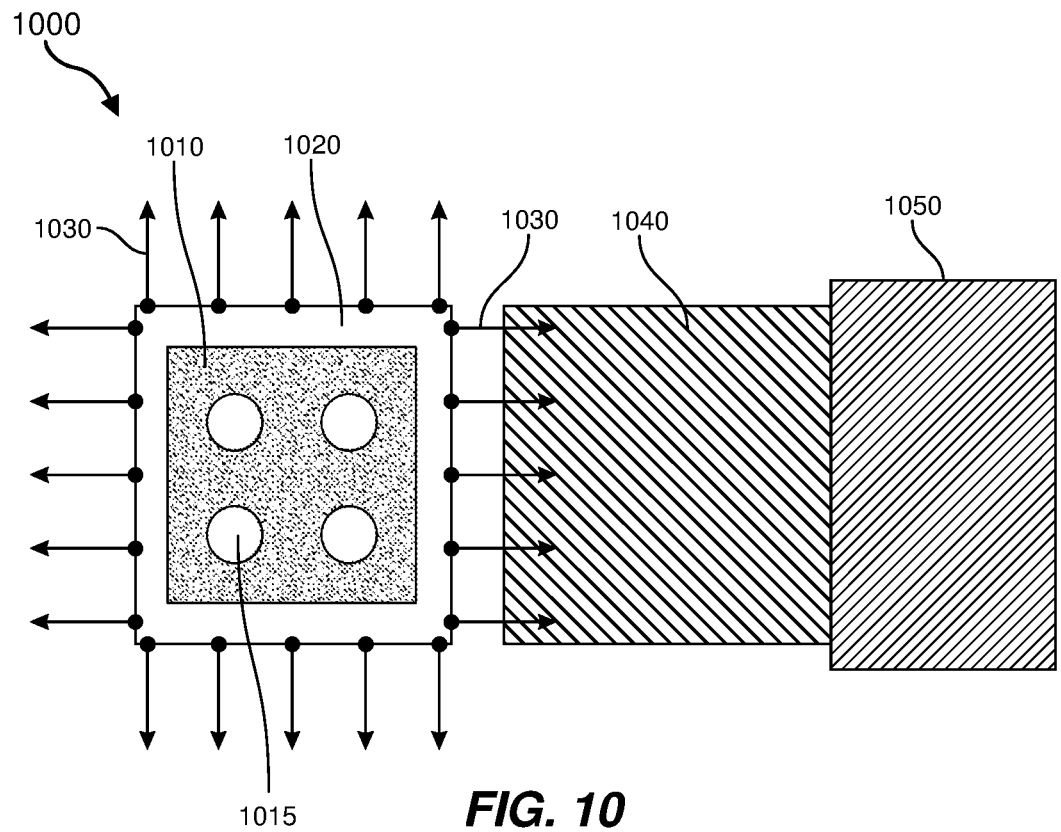
FIG. 10 shows a top view of a biaxial stretcher.

In some examples, voids may have an initially anisotropic form, and an apparatus such as shown in FIG. 10 may be used to deform the voids further, for example, along a direction orthogonal to an initial direction of stretching.

An actuator may be configured to stretch a material, and the actuator may include a stepper motor, other motor, or other type of actuator mechanism. In some examples, a stretcher apparatus may include a load cell or other sensor that may be configured to monitor the degree of stretching and/or the stretching force applied to the material. The substrate may be a flexible substrate. The substrate may include an intermediate layer. In some examples, a substrate may include a portion of a conveyor belt or similar support surface. The substrate may include an intermediate layer, for example, between the material and a support surface such as a conveyor belt. Grippers may clamp on an edge of the substrate, or may be otherwise connected to the substrate.

FIG. 10 shows a top view of a biaxial stretcher 1000 similar to the design of FIG. 9. The substrate 1020 is connected to grippers 1030 along the sides of the substrate. The rows of grippers are connected to linear arms and are pulled outwards by actuators to stretch the substrate 1020 and thereby the material 1010. Only one linear arm 1040 and actuator 1050 are shown, attached to one side of the material 1010. The grippers 1030 are denoted by arrows, and the arrowheads denote connection of the grippers to a linear arm, and also denote the respective direction of motion during stretching of the material 1010.

The material 1010 may include voids 1015, which may have (before stretching) a generally spherical form. After biaxial stretching (e.g., stretching along orthogonal directions), the material may include anisotropic voids. The anisotropic voids may be elongated along orthogonal directions, for example, along orthogonal stretching directions. The anisotropic voids may have a generally oblate spheroid shape and may have a pancake-like shape. Electrodes may then be deposited on a nanovoided polymer element including oblate spheroid shaped voids. The voids may be elongated along directions normal to the direction of an applied electric field (e.g., when an electrical potential is applied to the electrodes), for example, elongated along directions parallel to one or both of the electrodes.

In some examples, materials may be stretched after partial polymerization of the medium in which the voids are embedded, and the medium may be fully polymerized (and/or cross-linked) after stretching.

In some examples, a linear arm may be connected along an edge of a substrate, or a material, directly, using a connector that connects along the length of the edge, rather than using discrete grippers.

Figure 11:
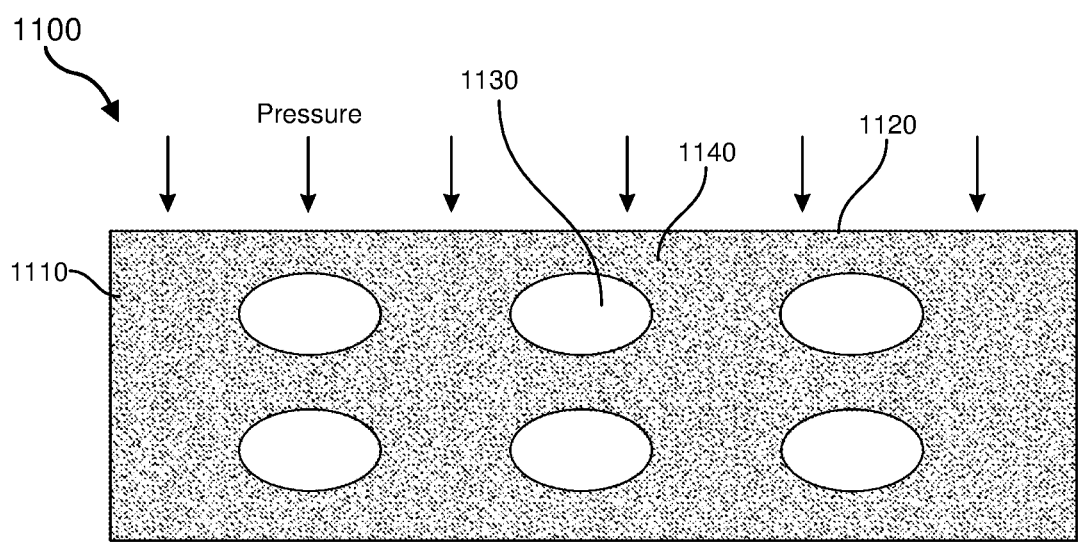
FIG. 11 illustrates formation of anisotropic voids using a pressure applied to the top surface of a material layer.

FIG. 11 illustrates operation of a pressing apparatus 1100. A pressure (denoted by arrows) is exerted on the top surface 1120 of a material 1110, forming anisotropic voids 1130 in the material. The application of pressure to the top surface 1120, represented by the downwards facing arrows, compresses the material 1110 along the vertical direction (as illustrated). As a result of compression, the material may include a matrix 1140 (e.g., a polymer matrix) including anisotropic voids 1130. The anisotropic voids may be elongated along one or more directions normal to the force direction. In some examples, the material may be partially polymerized before pressing, or any deformation, and fully polymerized after formation of anisotropic voids.

The pressure may be exerted by a compression stage, which may include one or more of any of the following: an actuator, a roller, a compression stage (such as a mechanical press), or other force exertion mechanism. The material may expand laterally (e.g., along directions in a plane normal to the direction of pressure), and voids may be elongated along the expansion directions. In some examples, expansion may be prevented along some directions, for example, by walls or other constraining structures, allowing the anisotropic form to be controlled.

Figure 12A:
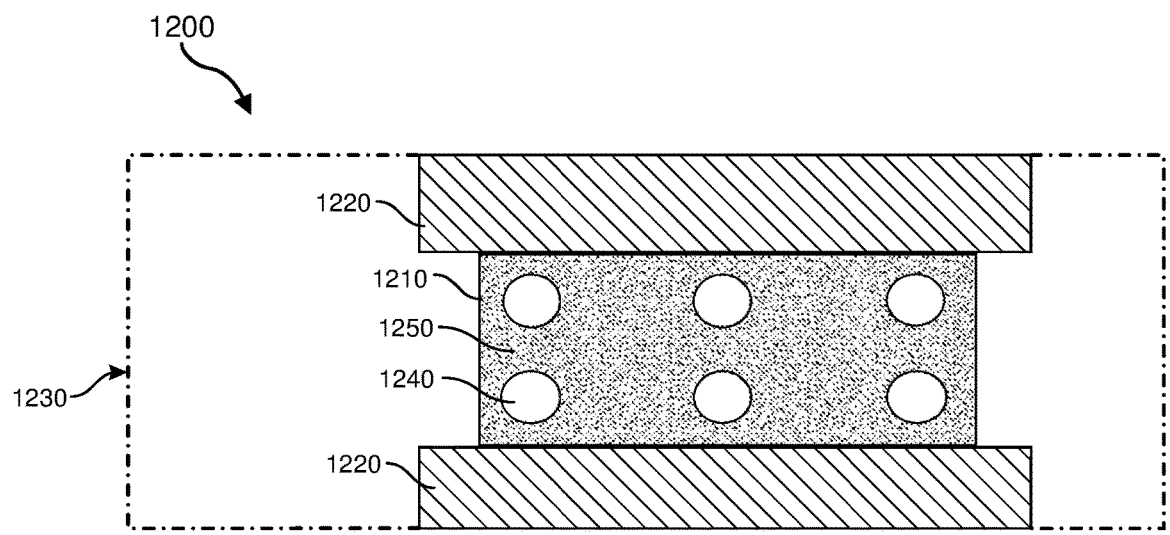
FIGS. 12A-12B show formation of anisotropic voids using a pressure chamber.

FIG. 12A shows a pressure chamber apparatus 1200, including a chamber 1230 (denoted by a dot-dash line, and not shown in detail) inside of which the material 1210 is located. The material 1210 is sandwiched between two substrates 1220. In this example, the substrates may be rigid and may effectively prevent expansion of the material along the vertical direction (as illustrated, e.g., effectively preventing expansion along a direction normal to a substrate surface). The material includes voids 1240 located within a matrix 1250. In this example, the material 1210 may be a nanovoided polymer and the voids may, initially, be generally spherical.

Figure 12B:
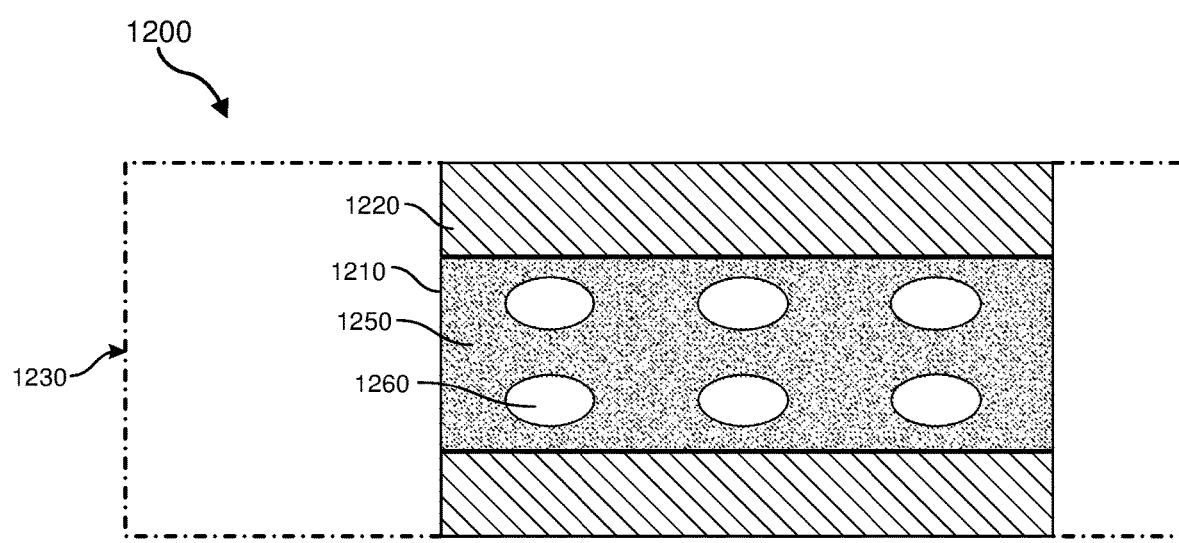

FIG. 12B illustrates an approach that includes reducing the pressure in the chamber 1230, so that the material 1210 expands laterally (as illustrated), for example, by allowing expansion along directions parallel to the substrate surface. In this example, the substrates 1220 restrict expansion of the material 1210 along the vertical direction, and hence the material expands horizontally (as illustrated) and anisotropic voids 1260 are formed. The anisotropic voids may be stretched along one or more horizontal directions by expansion of the material. In some examples, oblate (e.g., pancake or disk shaped) voids may be formed. In addition, expansion along one or more horizontal directions may be prevented (e.g., by walls or other constraining structures), allowing formation of anisotropic voids with different shapes to be obtained, such as generally prolate, tubular, or other shaped voids.

Figure 13A:
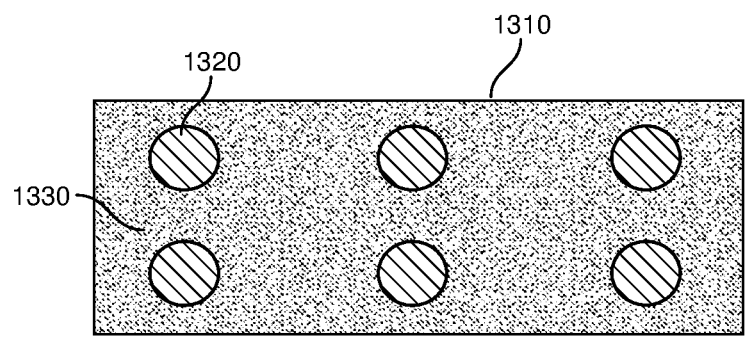
FIGS. 13A-13B show formation of anisotropic voids using an electric field applied to a material layer.
Figure 13B:
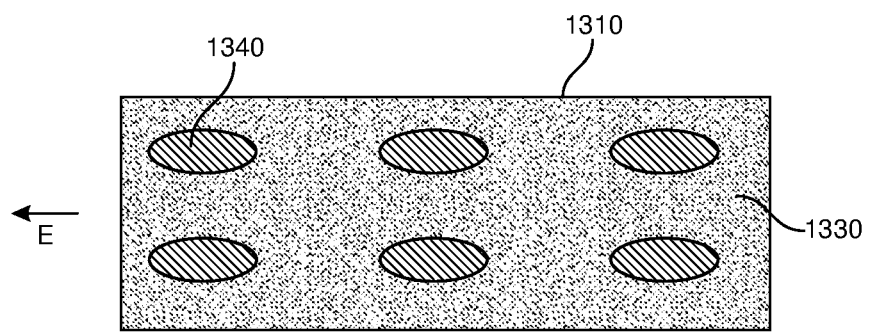

FIGS. 13A-13B shows how anisotropic voids may be formed by application of an electric field to a material. In some examples, the material 1310 may be (or include) an emulsion, with polymerization occurring after field-induced deformation of the voids. FIG. 13A shows an example material 1310, which may be an emulsion including spherical fluid droplets 1320 (that may later become voids in a solid material) in a medium 1330. The medium may be a liquid medium. In some examples, the medium may be partially polymerized, a field used to deform the voids, and then the medium may be fully polymerized to form a polymer matrix including anisotropic voids.

FIG. 13B illustrates the application of an electrical field (denoted E) along a horizontal direction (as illustrated), which may distort the fluid droplets to form anisotropic droplets 1340. The electric field E may be applied by electrodes, such as electrodes located on each side of the material. In some examples, an electrical field may be applied in a different direction, such as along an orthogonal direction to that shown in the figure. In some examples, electric fields may be applied along different directions at the same time, or may be applied sequentially.

In some examples, the liquid medium 1330 may be polymerized while the electric field E is applied. Polymerization may provide a material having anisotropic fluid-filled voids in a polymer matrix, such as an anisotropic nanovoided polymer. In some examples, fluid may be removed from the anisotropic voids, leaving anisotropic voids with a gaseous filling.

In some examples, one or more external fields may be used to obtain anisotropic voids, such as an electric field and/or a magnetic field. In some examples, a magnetic field may be used to distort the fluid droplets and provide anisotropic voids. In some examples, a material (e.g., an emulsion) may be deformed by flow-related and/or viscous effects, such as one or more of the following: flow, a shear gradient, passage through an orifice, or other approach. In some examples, vibrational inputs or acoustic/ultrasound fields may be used to obtain anisotropic voids. A method of obtaining an anisotropic voided polymer may include forming a fluid phase (such as an emulsion) including spherical fluid droplets (e.g., droplets within a medium, such as a liquid medium), deforming the fluid droplets using an external input (e.g., an electric or magnetic field, or other approach, such as a flow or vibration based deformation), and then polymerizing the medium. The medium may be polymerized, to a complete or partial degree, while the external input is applied. For example, an electric field may be applied, and the medium may be polymerized, to some degree, while the electric field is applied. For example, an electric field (or other external input) may be applied for at least a first time period, during which the droplets deform, and a second time period, during which some degree of polymerization occurs (e.g., partial or full polymerization, such as photopolymerization). Polymerization may continue after removal of the external input.

FIG. 14 shows a cross-section of a stretcher apparatus 1400 showing a material 1410 formed on an intermediate layer 1420, with the intermediate layer supported by a belt 1430 (e.g., a conveyor belt or similar). In this example, the belt is pulled in opposite direction by rollers 1440 and 1450, stretching the belt and thereby stretching the material, for example, to form anisotropic voids in the material. In some examples, the material may be stretched by rotation of the rollers in the same direction, but at different speeds. In some examples, the material may be formed on any appropriate substrate, and the substrate may be stretched by rollers, a roller and a fixed connection, a moveable arm mechanically coupled to an edge of the substrate, or any other appropriate approach.

In some examples, an electrical or magnetic field may be applied to the material while the material is supported by the substrate, and may be applied as the material is being stretched by deformation of the substrate. In some examples, a substrate (e.g., a conveyor belt) may include electrically conducting elements, such as a pattern of interdigitated electrodes, that may allow application of in-plane or out-of-plane electric fields.

FIG. 15 shows a cross-section of a stretcher apparatus 1500, showing a material layer 1510 formed on (or otherwise supported by) an intermediate layer 1520, with the intermediate layer supported by a conveyor belt 1530. The conveyor belt may be moved by first, second, and third rollers 1560, 1570, and 1580. The figure shows the voids being elongated along the travel direction of the conveyor belt, from generally isotropic voids 1540 (e.g., generally spherical voids) to anisotropic voids 1550, which may have an elongated shape (e.g., a generally prolate spheroid, elongated in the direction of stretching). The figure demonstrates that the voids may be elongated along the travel direction of the conveyor belt, which in this example may also be the stretching direction.

In some examples, the material may be stretched by rotation of the rollers at different speeds, or in opposite directions, or some combination thereof. In some examples, rollers may move the conveyor belt to the right. In some examples, rollers may rotate at similar angular speeds, and roller diameter variations may be used to vary forces on the material (e.g., by providing different surface speeds of the rollers). In relation to FIG. 15, in some examples, roller 1580 may rotate faster and/or may have a greater radius than roller 1570 and/or roller 1560. In some examples, roller 1570 may rotate faster and/or have a greater radius than roller 1560. In some examples, a control circuit may be used to one or more of: start; stop; slow down; or speed up one or more rollers, for example, to adjust stretching forces on the material (e.g., to apply, remove, or change such forces).

In some examples, an electrical or magnetic field may be applied to the material as a material is stretched by any approach described herein. For example, a material may be supported by a substrate, and the substrate may be stretched as an electric, magnetic, or other field is applied to the material. A substrate may include a conveyor belt (or similar support layer), an intermediate layer, or any other support layer.

Figure 16A:
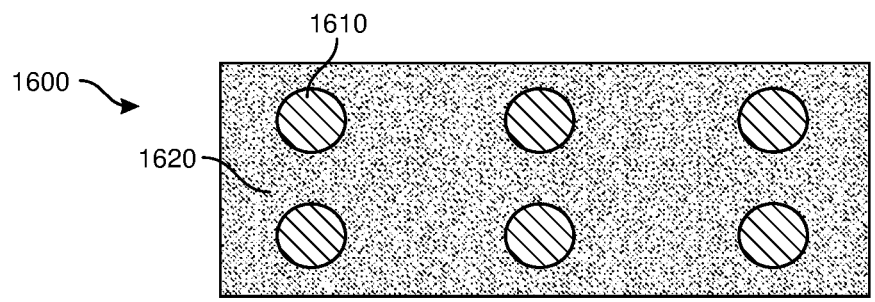
FIGS. 16A-16B show how shaped voids may be formed using fluid evaporation.
Figure 16B:
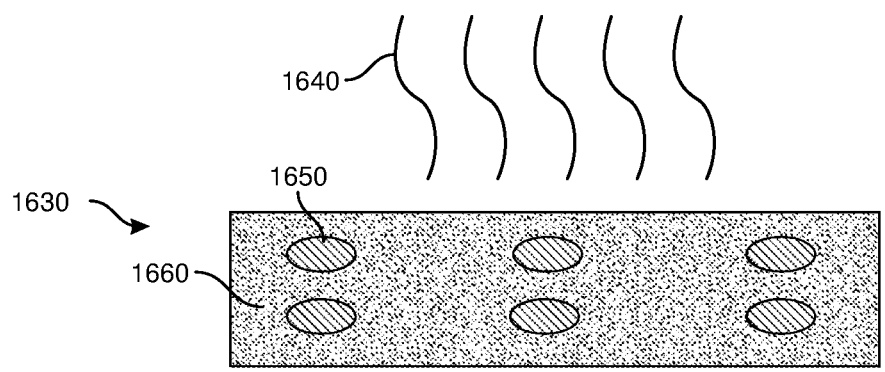

FIGS. 16A-16B show how shaped voids may be formed using fluid evaporation. A material may include fluid-filled droplets, which initially may be spherical. In some examples, the fluid droplets may include a combination of a low boiling point liquid and high boiling point liquid. After partial polymerization of the material, the material have liquid-filled droplets that include both low and high boiling point liquids (which may also be referred to as volatile and non-volatile liquids). The volatile liquid may then be removed from the material using a method, for example, including one or more of the following: heating (e.g., substrate heating, IR heating, or other approach), or by application of a reduced pressure.

FIG. 16A shows a material 1600 including droplets 1610 in a medium 1620. The medium 1620 may include a partially polymerized material, and the droplets 1610 may include generally spherical droplets including a volatile liquid. In this example, the term volatile may refer to a liquid that may be removed, in whole or in part, from the droplets, to an appreciable degree by, for example, heat and/or reduced pressure.

FIG. 16B shows modification of the material by removal of a volatile liquid from the droplets. FIG. 16B shows a modified material 1630 including anisotropic droplets 1650 in a medium 1660. The figure shows that void collapse, induced by removal of the volatile liquid, may induce formation of anisotropic voids. Removal of the volatile liquid is represented by wavy lines 1640. The wavy lines 1640 may represent vapor arising from removal of the volatile liquid. Void collapse may include shrinkage along a direction in which the material is not restricted, which in this example may be the vertical direction. For example, shrinkage may be along a direction orthogonal to the surface of a substrate on which the material is deposited. Anisotropic voids may be elongated along directions within a plane parallel to the substrate surface, and may have, for example, an oblate spheroid shape.

In some examples, void collapse may be assisted by capillary forces acting on the volatile liquid during extraction of the volatile liquid. Using a volatile liquid with a higher surface tension (e.g., compared with any high boiling liquid) may enhance this effect. The achieved anisotropy can be tuned via the ratio of the low/high boiling point solvents. The material may then then be fully polymerized, for example, using UV. Heating may be used, or increased, to drive out the high boiling point solvent. This method allows anisotropic voids to be formed within individual layers of deposited material in a multilayer configuration, without affecting the anisotropy of other layers.

In some examples, shaped voids may be formed using shaped particles that may be added to the material. Sacrificial particles may then be later be removed from the material. For example, anisotropic sacrificial particles may be added to a material, and then removed to leave anisotropic voids in the material. In some examples, particles may include hollow particles, such as anisotropic hollow particles. For example, hollow particles may include nanoballoons that may be added to a material, and may remain in an anisotropic nanovoided polymer. In some examples, the interior of a hollow anisotropic particle, such as the interior of a nanoballoon, may provide the anisotropic void. In some examples, particles may be initially spherical, and may then be deformed to form anisotropic particles by any appropriate method, such as the methods described herein for forming anisotropic voids. Example methods may include heating a material to facilitate deformation of particles into anisotropic particles. For example, hollow particles such as nanoballoons may be deformed at an elevated temperature. In some examples, particles may include polymer particles, such as hollow polymer particles. In some examples, particles may be heated above a glass transition temperature of a polymer component of a particle.

Shaped voids may also be formed using deformations of emulsions, lyotropic phases, or other soft matter phases, using applied fields, such as electrical or magnetic fields, and these may be applied in sequence with or concurrently with other deformations such as stretching, or as one or more material components are polymerized.

In some examples, spatial variation in material properties may be introduced, for example, by introducing variations (e.g., temporal and/or spatial variation) in one or more of the following: chemical composition, temperature of the material, salt or other component concentration, flow rate, agitation, vibrational amplitude, or external field strength (e.g., of ultrasound, electrical, or electromagnetic fields, such as optical or UV, or magnetic fields).

In some examples, shaped voids may be generated through nanopatterning using phase masks on photosensitive elastomers. Shaped voids may also be formed using a gas-diffusion expansion process.

Nonuniform void shape distributions may be achieved by applying a gradient in intensity of the radiation source throughout the partial polymerization. In regions subject to greater radiation intensity (and/or greater irradiation time, or other measure of effectiveness such as wavelength), polymerization may advance further. This may lead to a spatial variation in the Young's modulus of the material. When the material is stretched, a region with a lower Young's modulus may stretch more, and voids in those regions may have a larger anisotropy after stretching, compared to voids in regions having a higher Young's modulus.

In some examples, a deposition process (e.g., a printing process, such as ink jet printing) may allow deposition of a material having a spatially variable composition. For example, there may be a spatial variation in one or more of the following: concentration of crosslinker, material composition (e.g., monomer composition), and the like. After full or partial polymerization, there may be a spatial variation in a material property, such as Young's modulus, allowing a spatially varying anisotropy of voids.

In some examples, the Poisson ratio of the polymer emulsion may determine the aspect ratio of the spherical voids after the stretching of the film. The Poisson ratio relates to the amount of vertical compression to a certain amount of transverse stretching.

When the material is used for dielectric applications, pre-stretching may have beneficial effects on the dielectric performance. Pre-stretching the film may increase the pressure inside of the material, pushing volatiles out of the voids, and thereby increasing the breakdown voltage.

FIG. 17 illustrates an example method 1700 of forming a voided polymer element, such as a nanovoided polymer element, or of making an electroactive device including one or more such elements. Example methods may include, for example, forming an emulsion including fluid droplets within a liquid medium (1710). The method may further include partially polymerizing the liquid medium to form fluid droplets (which may be termed voids) in a (partially polymerized) material layer (1720); deforming the material layer to form anisotropic fluid droplets (which may be termed anisotropic voids) within the material layer (1730); and polymerizing the material layer to form anisotropic voids in a polymer matrix, which may be termed an anisotropic voided polymer (1740). In this example, the term "anisotropic voids" may include anisotropic fluid droplets (e.g., in a partially polymerized medium, or polymer matrix), and the term "anisotropic voided polymer" may include a polymer including anisotropic voids. In some examples, the term void may not necessarily refer to the absence of material, and may refer to a non-solid portion of a solid matrix or partially polymerized material. For example, fluid-filled regions of a polymer matrix or partially polymerized material may be referred to as voids. Example methods may optionally further include removing the one or more liquid components from the polymer element, for example, to replace a fluid with another fluid, such as a different gas or liquid. Example methods include methods of forming an anisotropic voided polymer element, for example, including anisotropic voids within a polymer matrix. The voids may include nanovoids. Examples may further include depositing a pair of electrodes on the anisotropic voided polymer element, so that at least a portion of the anisotropic voided polymer element is located between the pair of electrodes. The pair of electrodes may be part of a larger plurality of electrodes. Example methods may further include fabrication of an actuator and/or sensor device using the anisotropic voided polymer element, for example, using the pair of electrodes to apply an electric field to an anisotropic nanovoided polymer element, or to receive electrical signals from the pair of electrodes in response to a deformation of the anisotropic nanovoided polymer element.

FIG. 18 illustrates an example method 1800 of forming a voided polymer element, such as a nanovoided polymer element, or an electroactive device including one or more such elements. Example method 1800 may include, for example, forming voids in a polymer matrix (e.g., as an array or irregular arrangement of voids) at step 1810. The example method may further include deforming the polymer matrix to form anisotropic voids in a polymer matrix (step 1820). This may be termed an anisotropic voided polymer. The example method may also optionally include depositing electrodes on an anisotropic voided polymer (step 1830), so that, for example, at least a portion of the anisotropic voided polymer is located between a pair of electrodes. Electrodes may be formed directly on a surface of the anisotropic voided polymer or may be formed on one or more intermediate layers disposed thereon.

In some examples, a device includes an anisotropic nanovoided polymer including anisotropic nanovoids in a polymer matrix, a first electrode, and a second electrode. At least a portion of the anisotropic nanovoided polymer may be located between the first electrode and the second electrode. The anisotropic nanovoids may include oblate voids, such as oblate nanovoids. In some examples, an oblate nanovoid may be a nanovoid having an internal dimension of less than 1 micron. In some examples, an oblate nanovoid may have a generally oblate spheroidal shape, having an equatorial diameter greater than an (orthogonal) polar diameter. In some examples, an anisotropic nanovoided polymer may include prolate nanovoids, for example, nanovoids having a generally prolate spheroidal shape (e.g., having a polar diameter greater than an equatorial diameter). In some examples, a pair of electrodes may be spaced apart and generally parallel to each other, and the anisotropic nanovoided polymer may be a layer located at least in part between the pair of electrodes. The pair of electrodes may be part of a plurality of electrodes. In some examples, the equatorial plane of oblate nanovoids (e.g., nanovoids having a generally oblate spheroid shape) may be generally parallel to the plane of one or more electrodes. For example, the oblate nanovoids may have a dimension parallel to the plane of one or more electrodes that is appreciably greater than a dimension perpendicular to the respective electrodes. In some examples, prolate nanovoids may have a dimension parallel to the plane of one or more electrodes that is greater than a dimension perpendicular to the electrodes. In some examples, a degree of anisotropy may be defined as the magnitude of a ratio of a dimension parallel to the electrodes to a dimension perpendicular to the electrodes. The degree of anisotropy may be at least approximately 1.5, and in some examples, may be at least approximately 2, such as at least approximately 3.

An example NVP includes anisotropic voids. Isotropic (spherical) voids may lead to non-uniform wall thicknesses and unstable buckling under compression. Anisotropic voids may also provide more uniform wall thicknesses and smoother and more reproducible electroactive response curves. Voids may be appreciably wider (e.g., in the plane of the electrodes) than tall, and the dimension ratio (which may also be termed an anisotropy parameter) may range from, for example, at least 1.5, such as at least 1.7, for example, at least 2, and in some examples, up to, for example, approximately 10. Anisotropic voids facilitate compression in a direction normal to the plane of an electrode, for example, for anisotropic voids elongated in one or more directions parallel to the plane of the electrode. Similar approaches may be used with larger size scales, such as microscale voids. However, actuator response times may be longer with larger voids, particularly for closed void configurations, and may depend on the oxygen solubility of the polymer used.

Example polymers may include elastomers and may include, for example, silicone or acrylate (sometimes also termed acrylic) polymers, and may be thermoset or otherwise polymerized. Manufacturing approaches may include extrusion, compression, stretching, phase separation, partial void collapse under solvent removal (e.g., to give disk-shaped voids), some combination thereof, and the like. Applications of such polymers include actuators, which may be relatively tolerant of random variations in void properties.

In some examples, a device includes a voided polymer element including an arrangement of voids; a first electrode; and a second electrode, where the voided polymer element is located at least in part between the first electrode and the second electrode. In these examples, the arrangement of voids may include anisotropic voids having a first dimension along a first direction greater than a second dimension along a second direction (e.g., along a second direction orthogonal to the first direction). The voids may have an anisotropy parameter determined by a ratio of a first dimension measured parallel to the first electrode divided by a second dimension measured perpendicular to the first electrode. Voids with an anisotropy parameter of one may be isotropic voids. In some examples, the anisotropy parameter may be in the range approximately 1.5-10 (e.g., in the range approximately 1.7-10, approximately 2-10, approximately 2-8, approximately 4-8, etc.). In some examples, ranges are inclusive and/or may be approximate. In some examples, the anisotropy parameter is at least 1.5. In other examples, the anisotropy parameter is at least 2. The anisotropy parameter may be determined an average, such as a median or mean, for a portion of the voided polymer element.

The arrangement of voids may be configured so that polymer wall thicknesses between neighboring voids are generally uniform. For example, a thickest portion of the polymer walls may be no greater than 50% larger than a thinnest portion. This ratio may be determined by sectioning the voided polymer element and determining an average (such as a median or mean) for a portion of the element. The portion may include, for example, approximately 20 voids. In some examples, a device includes a voided polymer element having an arrangement of voids therein; a first electrode; and a second electrode, where the voided polymer element is located at least in part between the first electrode and the second electrode and the arrangement of voids is configured so that polymer wall thicknesses between neighboring voids are generally uniform.

In some examples, a void shape may be designed to increase the uniformity of polymer walls. The arrangement of voids may include anisotropic voids that are configured to increase polymer wall thickness uniformity, with the anisotropic voids having a first dimension greater than a second dimension.

In some examples, the device may be (or include) an actuator. The device may further include a control circuit, where the control circuit is configured to apply an electrical potential between the first electrode and the second electrode. The device may be a spatially addressable actuator and may be a component of a haptic device. The device may be flexible; for example, the device may have flexible substrates (option) on which flexible electrodes are disposed, sandwiching a flexible voided polymer layer. Application of an electrical signal between the first electrode and the second electrode may induce a deformation of the voided polymer element, a pressure on a neighboring element, or movement of a neighboring element. In some examples, the device is (or includes) an electrically controllable optical element, such as an electrically adjustable mirror or lens, and may be a component of a virtual reality or augmented reality system, a camera (such as a phone camera, video camera, self-contained camera), a projection system, telescope, binoculars, a portable electronic device, computer, or any other suitable electronic device or optical device, such as any autofocus system. The device may include one or more of a mirror, a lens, a prism, a grating, a phase plate, a diffuser, a holographic element, a beam splitter, a beam combiner, or an optical filter. The device may be (or include) a sensor. Examples include sensors (including touch sensors and any transducers) having greatly improved performance, particularly for relatively large mechanical inputs that induce significant mechanical compression (e.g., over 20%).

An example computer-implemented method includes applying an electrical signal between the first electrode and the second electrode of a device to obtain a desired surface deformation of the electroactive device. An example system includes at least one physical processor; physical memory including computer-executable instructions that, when executed by the physical processor, cause the physical processor to control application of electrical signals to a device to obtain an actuation of the device, and/or receive electrical signals from the device to obtain a sensor determination, for example, a touch detection or other sensor input. An example system includes a haptic device, a desired surface deformation being induced within the haptic device to provide haptic feedback to a user. An example system includes an optical element, with the desired surface deformation being induced within the optical element, and/or inducing a movement or deformation of an optical element such as a lens or mirror. An optical element may be a component of an augmented reality and/or virtual reality system, such as a headset, glasses, glove, or other AR/VR system or component thereof. An example non-transitory computer-readable medium includes one or more computer-executable instructions that, when executed by at least one processor of a computing device, cause the computing device to apply electrical signals to a device, for example, between the first and second electrodes of a device to obtain a desired actuation of the device, or a desired actuation of an optical element, or receive to receive sensor signals from a device.

In some embodiments, a method of fabricating an anisotropic voided polymer element includes depositing a voided polymer using a process including at least one of: spin coating, printing, chemical vapor deposition, vapor coating, transfer of a prefabricated polymer layer, dipping, or spraying; and deforming the voided polymer element by at least one of stretching, extruding, or pressing, to form the anisotropic voided polymer element. A fabrication method may further include forming electrodes, such as a first electrode and a second electrode on the anisotropic voided polymer element, so that at least part of the anisotropic voided polymer element is located between the first electrode and the second electrode.

In some examples, a method of fabricating an anisotropic voided polymer element includes depositing a voided polymer using a process including at least one of spin coating, printing (e.g., ink-jet printing), vapor deposition (e.g., chemical vapor deposition), vapor coating, transfer of a prefabricated polymer layer, dipping, or spraying; and deforming the voided polymer element by at least one of stretching, extruding, or pressing, to form the anisotropic voided polymer element. In some examples, a method may further include forming a first electrode and a second electrode on the anisotropic voided polymer element so that at least part of the anisotropic voided polymer element is located between the first electrode and the second electrode. In some examples, compositional variations may be introduced into a material using ink-jet printing. In some examples, compositional variations in a material layer may be used to introduce spatial variations in the electroactive properties of a nanovoided polymer formed from the material layer.

In some examples, a device, such as a polymer actuator, includes voids having generally non-spherical shapes. The void shapes may be configured to suppress buckling in the material and allow the material to be greatly compressed from its original shape in a controllable manner. The voids may be air-filled. A functional material may include a voided polymer where the voids are anisotropic in shape. Example anisotropic shapes include prolate shapes (e.g., elongated spheroids), elongate shapes such as cylinders (e.g., with rounded ends), oblate shapes (e.g., flattened spheroids), flattened shapes such as disks, and other geometric shapes. In some examples, a shorter dimension of a void shape may be aligned with the direction of compression of the NVP layer. The voids may be distributed periodically throughout the polymer layer, or in some examples may have no long-range periodicity. In some examples, a functional material is constrained to prevent expansion or contraction in one or more directions. In some examples, a voided polymer is used as the dielectric layer in an electrostatic actuator, such as an actuator that operates via mechanical actuation. The voided polymer material may include one or more polymer components, such as a silicone-based polymer, or an acrylate polymer. The voided polymer element may include an elastomer and/or a thermoset polymer. The voided polymer material may be actuated through compression or tension in one or more dimensions. For example, the voided polymer material may be actuated through compression or tension in two dimensions.

As used herein, "electroactive polymers" may (in some examples) refer to polymers that exhibit a change in size or shape when stimulated by an electric field. Some electroactive polymers may find limited applications due to a low breakdown voltage of the polymers with respect to the operating voltage used by electroactive devices (e.g., actuators) that use the polymers. Electroactive devices with reduced operating voltages and higher energy densities may be useful for many applications.

In some examples, a polymer, such as an electroactive polymer, may include a deformable polymer that may be symmetric with regard to electrical charge (e.g., polydimethylsiloxane (PDMS), acrylates, etc.) or asymmetric (e.g., poled polyvinylidene fluoride (PVDF) or its copolymers such as poly(vinylidenefluoride-co-trifluoroethylene) (PVDF-TrFE)). Additional examples of polymer materials forming electroactive polymer materials may include, without limitation, styrenes, polyesters, polycarbonates, epoxies, halogenated polymers, such as PVDF, copolymers of PVDF, such as PVDF-TrFE, silicone polymers, and/or any other suitable polymer materials. Such materials may have any suitable dielectric constant or relative permittivity, such as, for example, a dielectric constant ranging from approximately 2 to approximately 30.

Examples include polymer devices, such as a polymer actuator. An example actuator may include a long thin block of material, which may include a polymer. A polymer actuator may compress in response to an applied electrical field. The degree of compression may be controlled by controlling the magnitude (e.g., the root mean square (rms) value) of the applied electric field. The actuator may take on a desired configuration and may exert a force on an adjacent surface. In some examples, the actuator may be used to modify an optical element (e.g., adjust the focal length of a flexible lens), or provide haptic feedback.

In example applications, several polymer actuators can be positioned along the rim of a pair of glasses including a flexible lens, such as a lens filled with a liquid. An electric field can be used to move the actuators so that they exert a force on the lens and change the focal point of the lens. Actuators may be configured to move an adjacent surface, for example, by distances up to 1 cm. The electrode separation may be of millimeter or sub-millimeter order to maintain reasonable voltage requirements for the actuator (e.g., less than 1 kV).

An actuator in compression may expand laterally, unless the actuator is laterally constrained, for example, by sidewalls. If the electroactive element of the actuator is constrained so that it cannot expand laterally, the force required to compress a solid electroactive element may be high, particularly if the electroactive element polymer material is close to incompressible. A NVP material may include many small pockets of gas (which may be referred to as voids). In some examples, voids may include a liquid, and the liquid may be removed by a process such as heating and/or reduce pressure. An NVP may be used as an electroactive element, and it may take less force to compress an NVP than a similarly sized solid polymer element. In some examples, compression of a gas (e.g., air) in the voids requires one or more orders of magnitude less force than that required to compress a solid block of material. Further, components of air (such as nitrogen and/or oxygen) may dissolve in the polymer matrix under compression, further reducing the force required to compress the NVP.

Voids may also help enable more precise control over how much the electroactive element deforms in response to a given electric field. In many applications, an ideal actuator compresses gradually as more voltage is applied, in a monotonic and reversible manner, whereas a poor actuator may show instability above a given voltage, for example, where the structure may rapidly collapse to a highly compressed state. An unstable actuator may no longer have a predictable voltage-actuation curve. The voltage-actuation curve may no longer be a monotonic function, and in some examples may show appreciable hysteresis. These effects may be reduced or substantially eliminated using a voided polymer element, such as an anisotropic voided polymer element.

In some examples, an example actuator may exhibit one or more advantageous properties. In some examples, an actuator may have a predictable and repeatable actuation response to a specified range of voltages. For example, the voltage-actuation response may be generally independent of the actuation history (e.g., whether actuation is increasing or decreasing). The actuation mechanism may survive many cycles of extending and retracting. The actuator response time may be sufficiently fast. This may depend on the application, but, in some examples, actuators may have a response time of less than 1 second, for example, from zero to maximum actuation, and in some examples, the response time may be less than 100 msec. In some examples, actuators may achieve a maximum bulk compression of 50% or more.

In some embodiments, voided polymers may be created with spherical voids. In some manufacturing processes, spheres may be the relatively simplest shape to create. Arranging spherical voids for a high void fraction, configurations such as face-centered cubic (fcc) or body-centered cubic (bcc) may be used. However, using a spherical shape may lead to two problems in some examples. First, it may not be mathematically possible to make designs with a void fraction of over approximately 74%, as this is the packing limit for spherical voids (either in periodic or non-periodic arrangements). Designs having a void fraction close to the theoretical maximum have very thin walls in some locations and relatively thick walls elsewhere. Secondly, since the thickness of solid material between voids (wall thickness) may be highly variable with spherical voids, this encourages a buckling response as the material is compressed. Buckling of the material may lead to a rapid collapse that makes it difficult to control the actuation response with a high degree of precision.

Example actuators provide a mechanical component which moves in response to an input electrical signal. Anisotropic voids have spatial non-uniformity that differs in one direction from another direction. Anisotropy may be determined for orthogonal directions, for example, parallel to the plane of the electrodes and normal to the plane of the electrodes. Anisotropy may be determined for directions perpendicular to an electrical field and parallel to an electric field. For example, the mean thickness of an air void may be shorter in the height direction (perpendicular to an electrode) than in the length or width direction (parallel to the electrodes, for the case of parallel electrodes).

Actuation may be measured as a bulk compression. Compression may be measured in absolute units (e.g., a length unit) or as a fraction, for example, the fraction of the deformation relative to an original undeformed dimension of the actuator. For example, if the actuator is compressed and the thickness after compression is 70% of the original uncompressed thickness, then the bulk compression is 30%. Buckling is a usually undesirable behavior where part of a structure bends and folds over itself when a load is applied. Buckling is an instability that may trigger large deformations and a reduction in the load carrying capacity of the structure.

Voids may include a non-solid pocket in a solid polymer matrix. A void may be filled with air, an inert gas, or another gas (such as a high dielectric gas including polar molecules). Voids may include nanovoids, and examples may include nanovoided polymer elements (NVPs) with anisotropic voids. A nanovoid may have a diameter or other analogous dimension less than 1 micron, for example, in the range 1 nanometer −1 micrometer. The void fraction may represent the fraction of volume of the actuator (when in its original state with 0% bulk compression) occupied by voids, for example, by air or an inert gas. In some examples, voids may include microvoids, for example, with a void diameter or analogous dimension in the range of approximately 500 nm-500 microns, such as in the range 1 micron-100 microns.

Examples include an electroactive device, such as an actuator, with nanovoids having a non-spherical shape. In some examples, the voids have a form-fitting shape that results in more uniform wall thicknesses.

Anisotropic voids may be fabricated through processes such as pre-stretching or pre-tensioning a polymer element (such as an actuator element), for example, using an extrusion process, or a drawing process, or other process including a mechanical deformation such as stretching, pressing, or the like. Anisotropy may be locked in after stretching, for example, by further (e.g., complete) polymerization, crosslinking, curing, or other process. In some examples, an nanovoided polymer material may be extruded through a nozzle, which may have a generally slot-like opening, to form an anisotropic nanovoided polymer. A slot like opening may have one dimension (e.g., which may be termed a length or height) in the range of approximately 1 mm-approximately 10 mm, and a width in the range of approximately 10 microns-1 mm. In some examples, an anisotropic nanovoided polymer may be extruded in the form of a fiber, and used in, for example, an electroactive fabric. An electroactive fabric may include a mixture of electroactive and non-electroactive fibers, and an arrangement of electrodes and connections (e.g., which may include conducting fibers) may be used to apply or collect electrical signals.

In some examples, shaped voids may be formed using one or more approaches, such as; introduction of shaped particles that may later be removed (e.g., shaped sacrificial particles), distortion of emulsions or lyotropic phases as a function of chemical composition, temperature, salt or other component concentration, flow rate, agitation, external fields (such as ultrasound, electrical, electromagnetic such as optical or UV, or magnetic fields). In some examples, voids may be extended arbitrarily along a direction, such as a direction parallel to an electrode, so that the voids may include elongated shaped tubes with, for example, an anisotropic cross-section.

For actuator use, an electrical voltage may be applied between two electrodes, where at least a portion of the NVP is located between the two electrodes. Electrodes may be deposited onto the electroactive element. For example, first and second electrodes may be deposited so that at least part of the electroactive element lies between the electrodes. In some examples, a plurality of electrode pairs may be deposited. An electrode may be formed from an electrode material, such as a metal, alloy, or other conducting material such as graphite, graphene, carbon nanotubes, electrically conducting polymers, semiconductors, semi-metals, and the like. Suitable electrode materials include aluminum, indium, gallium, zinc, and other metals. Other conductive materials may be used including carbon nanotubes, graphene, transparent conductive oxides, and the like. The electrode coater may be a thermal evaporator, a sputtering system, or a spray coater.

An electrode layer may be very thin, for example, having an electrode layer thickness of between approximately 10 nm and approximately 50 nm. The electrode layer may be designed to allow healing of electrical breakdown in the EAP layer. A typical thickness of a self-healing aluminum electrode may be, for example, about 20 nm.

Example devices may include actuators, for example, having electrically-controllable compression, curvature, pressure on skin, texture, vibration, or other haptic function. Devices may be stacked to increase actuation. Example devices may be used to control optical elements, such as focal length or positional adjustments of lenses, mirrors, or other optical elements. Applications include improved autofocus and adaptive optics applications, such as in imaging devices. Applications also include wave-front correction of optical or other electromagnetic fields, for example, in projection systems. Examples include fine control actuators that can be combined with a coarser control actuator for extended actuation range. In some examples, actuators may be stacked to obtain enhanced actuation range. Examples also include sensors responsive to, for example, pressure (e.g., touch, acoustic signals, or vibration), temperature, and the like. Anisotropic voids may allow a more reproducible deformation under pressure and improved sensor operation. A sensor circuit may determine the magnitude of a mechanical input from a capacitance change. Example device structures described herein may also provide improved capacitance-deformation curves and improved sensor accuracy. Devices, such as sensors and actuators, may be curved, flexible, or otherwise conformal to an underlying substrate. Examples also include optical elements, such as gratings, holographic elements, lenses, mirrors, and the like. Electrodes may be transmissive or reflective. A device with reflective or transmissive electrodes may be an electrically-controllable optical element. In some examples, electrodes may be stretchable allowing bending. An example device may function both as an actuator and a touch sensor, and may also be reflective and/or optically transparent.

Examples also include actuators configured to control a flexible lens (e.g., a liquid lens), flexible mirror, grating, prism, fiber, holographic element, or other optical element.

An electroactive device may include any device that either converts electrical energy to mechanical energy, or the reverse, or both, such as a sensor and/or an actuator. Electroactive devices may be used as haptic devices, optical elements, and other applications.

A nanovoided polymer may include a polymer material having voids therein. The voids may have a typical dimension of between 10 and 500 nm, such as between 50 and 200 nm. The voids may be closed cell (in which gas phase regions are isolated and surrounded by polymer) or open cell (in which gas phase regions are connected to each other).

In some examples, electrodes may be deposited on an intermediate layer supported by the voided polymer layer. An intermediate layer may include one or more planarization layers. A planarization layer may provide a surface of reduced surface roughness for the deposition of the electrodes.

In some examples, one or more components of the device (such as a nanovoided polymer element, intermediate layer, or any other layer or component of the device) may include one or more polymers. For example, a nanovoided polymer element, or a layer formed on a nanovoided polymer element, may include one or more polymers selected from the following: acrylate polymers; silicone polymers; halogenated polymers; other polymers; or blends or derivatives thereof. Halogenated polymers may include polymers such as fluoropolymers, such as polyvinylidene difluoride (PVDF, polytetrafluoroethylene), copolymers of PVDF such as PVDF:TrFE (poly(polyvinylidene fluoride-trifluoroethylene), other fluorinated polyethylenes, or other fluorinated polymers. In some examples, one or more other components of the device, such as a nanovoided polymer element, may include one or more polymers, and may include particles (such as nanoparticles) selected to increase a dielectric constant, and the particles may include inorganic particles such as one or more of the following: titanates (including barium titanate or barium strontium titanate ($BaSrTiO_3$)); oxides such as titanium dioxide ($TiO_2$), tantalum oxide ($Ta_2O_3$), aluminum oxide ($Al_2O_3$), or cerium oxide ($CeO_2$); other metal oxides such as other transition metal oxides, other non-metal oxides, or other compounds such as $PbLaZrTiO_3$, $PbMgNbO_3+PbTiO_3$. In some examples, mixtures of curable monomers with cured polymers may also be used. In some examples, a voided polymer layer may include one or more particles and/or one or more polymers as discussed herein.

In some examples, electroactive devices may be fabricated by nanovoided a process including depositing a curable material (e.g., a monomer such as an acrylate or a silicone) and a solvent for the curable material onto a substrate, heating the curable material with at least a portion of the solvent remaining with the cured monomer, and removing the solvent from the cured monomer. Using this process, voids such as nanovoids may be formed in the electroactive element. In some embodiments, a flowable material (e.g., a solvent) may be combined with the curable materials (e.g., monomers and conductive materials) to create a flowable mixture that may be used for producing electroactive polymers with nanovoids. The monomers may be monofunctional or polyfunctional, or mixtures thereof. Polyfunctional monomers may be used as crosslinking agents to add rigidity or to form elastomers. Polyfunctional monomers may include difunctional materials such as bisphenol fluorene (EO) diacrylate, trifunctional materials such as trimethylolpropane triacrylate (TMPTA), and/or higher functional materials. Other types of monomers may be used, including, for example, isocyanates, and these may be mixed with monomers with different curing mechanisms.

In some examples, a method of generating a nanovoided polymer for use in connection with an electroactive device (such as electroactive devices described variously herein) may include co-depositing a monomer or mixture of monomers, a surfactant, and a nonsolvent material associated with the monomer(s) which is compatible with the surfactant. In various examples, the monomer(s) may include, but not be limited to, ethyl acrylate, butyl acrylate, octyl acrylate, ethoxy ethyl acrylate, 2-chloroethyl vinyl ether, chloromethyl acrylate, methacrylic acid, allyl glycidyl ether, and/or N-methylol acrylamide. Other curing agents such as polyamines, higher fatty acids or their esters, and/or sulfur may be used as the monomer(s). In some aspects, the surfactant may be ionic or non-ionic (e.g., sorbitan monooleate). In some examples, the non-solvent material may include organic and/or inorganic non-solvent materials. For instance, the non-solvent material may include water or a hydrocarbon or may include a highly polar organic compound such as ethylene glycol. The monomer(s), non-solvent, and surfactant material(s) may be co-deposited. Alternatively, the monomer(s), non-solvent, and/or surfactant may be deposited sequentially. In some examples, a substrate temperature may be controlled to generate and control one or more properties of, for example, an emulsion generated by co-depositing or sequentially depositing the materials. The substrate may be treated to prevent destabilization of the emulsion. For example, a metal layer, such as an aluminum layer, may be coated with a thin polymer layer formed by depositing a monomer, followed by curing the monomer.

A controller may be configured to apply electrical signals to a plurality of electrodes of an electroactive device, for example, to obtain a desired surface deformation of an actuator and in some examples of an optical element including an actuator, such as a lens or mirror.

In some examples, a spatially addressable electroactive device includes a NVP element having a first and second surface, a first electrode supported by the NVP element, and a second electrode supported on the second surface. Example devices include a spatially addressable electroactive device such as an actuator, an optical element such as a transmissive or reflective optical element, or a sensor.

In some example devices, electrodes may be stretchable. In some example devices, an electrode may be disposed on a substrate, which may be a flexible and/or stretchable substrate. In some example devices, an NVP may support a plurality of electrodes (e.g., including the first electrode in examples above), and the second electrode may be a common electrode, such as a ground. In some examples, electrodes may include an array of electrical conductors of a pre-defined shape arranged in a pre-defined pattern.

In some examples, an electroactive device may be spatially addressable and may provide the ability to apply and/or read different signals at different spatial locations on the device. In some examples, multiplexing schemes can be used to apply electrical signals. In some examples, electrode pairs may be provided by the intersection of electrode stripes on each side of the NVP, for example, between orthogonal electrode stripes.

Example devices may be used in a range of applications. For example, a spatially addressed nanovoided polymer can be locally actuated. Actuation may be controlled by the size and arrangement of the electrodes at that location and the amount of voltage applied at those electrodes. Example devices can be used as an optical element, a touch sensor, a thermal sensor, a pressure sensor, or a haptic element in a wearable device.

A device may further include a control circuit configured to apply an electrical potential between the first electrode and the second electrode. A control circuit may be further configured to determine a physical deformation between the first electrode and the second electrode, for example, based on a capacitance determination. A device may be generally transparent, for example, including a nanovoided polymer that is generally transparent, and transparent electrodes (e.g., transparent conductive oxide electrodes such as tin oxide, indium tin oxide, and the like). A first electrode (and/or a second electrode) may be generally transparent, or in some examples may be generally reflective. A device may be flexible, and in some examples transparent and flexible.

An example device may include a spatially addressable actuator. Application of an electrical signal between the first electrode and the second electrode, and/or between other electrodes of the device, may induce a two-dimensional and/or three-dimensional conformational change of the nanovoided polymer element.

In some examples, the device may include an electrically controllable optical element, which may include one or more of a mirror, a lens, a prism, a grating, a phase place, a diffuser, a holographic element, a beam splitter, a beam combiner, or an optical filter. In some examples, the device may include a sensor, such as a touch sensor. An actuator may be controlled by an electrical potential between the first electrode and the second electrode, and a sensor responsive to a capacitance between the first electrode and the second electrode may be used to determine a degree of actuation (such as a displacement, relative displacement, or other deformation parameter).

In some examples, a system includes at least one physical processor and physical memory including computer-executable instructions that, when executed by the physical processor, cause the physical processor to control a deposition apparatus and/or stretching apparatus, for example, as described herein.

In some examples, a non-transitory computer-readable medium includes one or more computer-executable instructions that, when executed by at least one processor of a device, cause the device to deposit a material film, and/or process the material film using methods as described herein to form an anisotropic voided polymer, such as an anisotropic nanovoided polymer.

In some examples, a computer-implemented method includes application of electrical signals to a plurality of electrodes to obtain a desired surface deformation of an actuator, where the surface of the actuator supports a planarization layer on which the plurality of electrodes is disposed.

In some examples, a non-transitory computer-readable medium includes one or more computer-executable instructions that, when executed by at least one processor of a computing device, cause the computing device to control application of electrical signals to a plurality of electrodes of a device, such as an actuator to obtain a desired surface deformation of the device by application of electrical signals to electrodes. In some examples, signals of the same polarity may be applied to proximate electrodes to generate electrostatic repulsion and, for example, an increase in electrode separation.

In some examples, a computer-readable medium may include one or more computer-executable instructions that, when executed by at least one processor of a computing device, may cause the computing device to apply electrical signals to a plurality of electrodes of an electroactive device including an NVP element, for example, to obtain a desired surface deformation of the electroactive device. In some examples, a computer-readable medium may include one or more computer-executable instructions that, when executed by at least one processor of a computing device, may cause the computing device to receive and analyze electrical signals from a plurality of electrodes of an electroactive device including a NVP element, for example, to sense a surface deformation of the electroactive device, for example, to provide a sensor output representative of a surface deformation.

Example methods of fabricating NVP elements with anisotropic voids may include forming a material layer including voids and/or fluid droplets, and deforming the material layer to form anisotropic voids and/or droplets. In some examples, voids may be initially filled with one or more liquids, and liquid removal from the voids may induce partial void collapse into an anisotropic shape. For example, voids may initially be filled a plurality of liquid components, and preferential evaporation of at least one liquid component may induce void collapse.

Example approaches may also include applying a mechanical deformation to an NVP film, such as stretching in one or more directions, compression, or extrusion. Substrates may be used to apply mechanical deformations to an NVP element, and in some cases a substrate itself may be deformed to convey a deformation to an NVP element. Approaches may include using anisotropic particles (e.g., hollow nanoparticles), deformation of soft matter phases such as emulsions or lyotropic phases, application of electrical or magnetic fields, gas-diffusion expansion, or the use of IR, heat, or reduced pressure to remove liquid components. The NVP element may be partially polymerized before formation of anisotropic voids, with polymerization and/or cross-linking subsequently completed to lock in the anisotropic void shape(s). Spatial variations may be introduced using, for example, ink jet printing, or variations in radiation (e.g., UV) intensity.

In some examples, a method includes: forming a material layer, including fluid-filled voids in a medium, on a substrate; deforming the material layer to form anisotropic voids; and polymerizing the medium to form an anisotropic voided polymer including the anisotropic voids in a polymer matrix. In some examples, a method may further include depositing electrodes on the anisotropic voided polymer so that at least a portion of the anisotropic voided polymer is located between the electrodes. However, in some examples, approaches described herein may be used to fabricate non-electroactive articles, such as voided polymers used in various articles of manufacture. In some examples, an article of manufacture may include anisotropic voided polymer, such as an anisotropic voided polymer as described herein. A non-electroactive response, such as restoration of a voided polymer element to an initial state after a mechanical deformation, may be characterized by a mechanical response time. A mechanical response time may, for example, characterize an exponential or other time-dependent change in material properties (such as a dimension in a given direction) in response to a mechanical input. In some examples, an anisotropic voided (e.g., nanovoided) polymer may have a reduced mechanical response time, for example, in comparison to a voided polymer having larger voids and/or non-anisotropic voids.

In some examples, a material layer may include a matrix including one or more partially polymerized materials, which may be termed a partially polymerized matrix. In some examples, a degree of polymerization (e.g., of a partially polymerized material, such as a partially-polymerized matrix) may be determined by one or more analytical techniques, such as UV-visible spectroscopy, infrared (IR) spectroscopy, or nuclear magnetic resonance (NMR) spectroscopy. (One or more analytical techniques may also be used to determine, and in some examples, to quantify, a degree of stretching). In some examples, the degree of polymerization may be in the range of approximately 10% to approximately 80%, for example, between approximately 20% and approximately 70%, such as between approximately 30% and approximately 60%. In some examples, a partially polymerized matrix may have a viscosity (e.g., a shear viscosity, or other viscosity related to, e.g., a deformation) that may be one or more orders of magnitude greater (e.g., at least two orders of magnitude greater) than, for example, an analogous mixture of unpolymerized monomer components. In some examples, a partially polymerized matrix may have a viscosity (e.g., a shear viscosity, or other viscosity related to, e.g., a deformation) that may be one or more orders of magnitude less (e.g., at least two orders of magnitude less) than, for example, an analogous fully polymerized polymer matrix. Viscosities of partially polymerized materials may be compared with, for example, unpolymerized or fully polymerized materials, under similar conditions (e.g., the same temperature), using any appropriate viscometer, such as a rotational viscometer, vibrational viscometer, oscillating piston viscometer, or other viscometer. In some examples, a degree of polymerization may be estimated from the force (e.g., shear force) or the magnitude of another external stimulus required to obtain a desired deformation. In some examples, a partially polymerized material layer may include a combination of partially polymerized polymers, or a combination of a polymer and an unpolymerized monomer (or other polymerizable component). In some examples, a partially polymerized matrix may include cross-linkable groups, which may be cross-linked after deformation, for example, to "lock in" anisotropy, for example, to obtain the anisotropic voided polymer. In some examples, a fully polymerized material (which, e.g., may be termed a polymerized material, or polymer, for conciseness) may include a material in which a polymerization reaction has proceeded to over 90% completion, or effectively to completion, or approximately to completion.

EXAMPLE EMBODIMENTS

Example 1. A method includes: forming a material layer on a substrate, the material layer including fluid-filled voids within a partially polymerized matrix; deforming the material layer to form anisotropic voids; and polymerizing the material layer to form an anisotropic voided polymer including the anisotropic voids in a polymer matrix.

Example 2. The method of Example 1, further including removing a fluid from the anisotropic voided polymer to form an anisotropic voided polymer including gas-filled anisotropic voids.

Example 3. The method of any of Examples 1-2, where deforming the material layer includes stretching the material layer.

Example 4. The method of any of Examples 1-3, where deforming the material layer includes stretching the substrate.

Example 5. The method of any of Examples 1-4, where stretching the substrate includes stretching the substrate using one or more rollers.

Example 6. The method of any of Examples 1-5, where stretching the substrate includes stretching the substrate in two orthogonal directions.

Example 7. The method of any of Examples 1-6, where deforming the material layer includes compressing the material layer along at least one direction.

Example 8. The method of any of Examples 1-7, where deforming the material layer includes applying an electric field or magnetic field to the material layer.

Example 9. The method of any of Examples 1-8, where deforming the material layer includes removing a fluid component from the fluid-filled voids, where removing the fluid component from the fluid-filled voids induces a partial collapse of the fluid-filled voids.

Example 10. The method of any of Examples 1-9, where forming the material layer on the substrate includes: forming a layer on the substrate, the layer including fluid filled voids within a medium, the medium including a polymerizable component; and partially polymerizing the polymerizable component to form the material layer.

Example 11. The method of any of Examples 1-10, further including removing the anisotropic voided polymer from the substrate.

Example 12. The method of any of Examples 1-11, further including depositing electrodes on the anisotropic nanovoided polymer so that at least a portion of the anisotropic nanovoided polymer is located between the electrodes.

Example 13. The method of any of Examples 1-12, further including forming an electroactive device using the anisotropic voided polymer, where the electroactive device is a sensor or an actuator.

Example 14. The method of any of Examples 1-13, where the polymer matrix is an electroactive polymer matrix.

Example 15. The method of any of Examples 1-14, where the polymer matrix includes at least one of a silicone polymer, or an acrylate polymer.

Example 16. The method of any of Examples 1-15, where the partially polymerized matrix includes at least one polymer having a degree of polymerization between 20% and 80%.

Example 17. The method of any of Examples 1-16, where the partially polymerized matrix includes at least one polymer having a degree of polymerization between 30% and 70%.

Example 18. A device, including: a first electrode; a second electrode; and an anisotropic nanovoided polymer including anisotropic nanovoids in a polymer matrix, where: at least a portion of the anisotropic nanovoided polymer is located between the first electrode and the second electrode, the polymer matrix is stretched in at least one direction within a plane parallel to the first electrode; and the anisotropic nanovoids include nanovoids having a generally oblate shape (e.g., an oblate spheroid shape), the generally oblate nanovoids being elongated within a plane parallel to the first electrode.

Example 19. The device of Example 18, where the polymer matrix is stretched in two orthogonal directions within the plane parallel to the first electrode.

Example 20. The device of any of Examples 18-19, where the device is a sensor or an actuator.

FIG. 19 shows an example near-eye display system such as an augmented reality system. The system 1900 may include a near-eye display (NED) 1910 and a control system 1920, which may be communicatively coupled to each other.

The near-eye display 1910 may include lenses 1912, electroactive devices such as actuators 1914, displays 1916, and one or more sensors 1918. Control system 1920 may include a control element 1922, a force lookup table (LUT) 1924, and augmented reality logic 1926.

Augmented reality logic 1926 may determine what virtual objects are to be displayed and real-world positions onto which the virtual objects are to be projected. Accordingly, augmented reality logic 1926 may generate an image stream 1928 that is displayed by displays 1916 in such a way that alignment of right- and left-side images displayed in displays 1916 results in ocular vergence toward a desired real-world position.

The control system 1922 may be configured to control one or more adjustable lenses, for example, a fluid element located within a near-eye display. Lens adjustment may be based on the desired perceived distance to a virtual object (this may, for example, include augmented reality image elements).

Control element 1922 may use the same positioning information determined by augmented reality logic 1926, in combination with force lookup table (LUT) 1924, to determine an amount of force to be applied by electroactive devices 1914 (e.g., actuators), as described herein, to lenses 1912. Electroactive devices 1914 may, responsive to control element 1922, apply appropriate forces to lenses 1912 to adjust the apparent accommodation distance of virtual images displayed in displays 1916 to match the apparent vergence distance of the virtual images, thereby reducing or eliminating vergence-accommodation conflict. Control element 1922 may be in communication with sensor 1918, which may measure a state of the adjustable lens. Based on data received from sensor 1918, the control element 1922 may adjust electroactive devices 1914 (e.g., as a closed-loop control system).

In some embodiments, display system 1900 may display multiple virtual objects at once and may determine which virtual object a user is viewing (or is likely to be viewing) to identify a virtual object for which to correct the apparent accommodation distance. For example, the system may include an eye-tracking system (not shown) that provides information to control element 1922 to enable control element 1922 to select the position of the relevant virtual object.

Additionally or alternatively, augmented reality logic 1926 may provide information about which virtual object is the most important and/or most likely to draw the attention of the user (e.g., based on spatial or temporal proximity, movement, and/or a semantic importance metric attached to the virtual object). In some embodiments, the augmented reality logic 1926 may identify multiple potentially important virtual objects and select an apparent accommodation distance that approximates the virtual distance of a group of the potentially important virtual objects.

Control system 1920 may represent any suitable hardware, software, or combination thereof for managing adjustments to adjustable lenses 1912. In some embodiments, control system 1920 may represent a system on a chip (SOC). As such, one or more portions of control system 1920 may include one or more hardware modules. Additionally or alternatively, one or more portions of control system 1920 may include one or more software modules that perform one or more of the tasks described herein when stored in the memory of a computing device and executed by a hardware processor of the computing device.

Control system 1920 may generally represent any suitable system for providing display data, augmented reality data, and/or augmented reality logic for a head-mounted display. In some embodiments, a control system 1920 may include a graphics processing unit (GPU) and/or any other type of hardware accelerator designed to optimize graphics processing.

Control system 1920 may be implemented in various types of systems, such as augmented reality glasses, which may further include one or more adjustable focus lenses coupled to a frame (e.g., using an eyewire). In some embodiments, a control system may be integrated into a frame of an eyewear device. Alternatively, all or a portion of control system may be in a system remote from the eyewear, and, for example, configured to control electroactive devices (e.g., actuators) in the eyewear via wired or wireless communication.

The control system, which in some examples may also be referred to as a controller, may control the operations of the light source and, in some cases, the optics system, which may include control of one or more fluid lenses. In some embodiments, the controller may be the graphics processing unit (GPU) of a display device. In some embodiments, the controller may include one or more different or additional processors. The operations performed by the controller may include taking content for display and dividing the content into discrete sections. The controller may instruct the light source to sequentially present the discrete sections using light emitters corresponding to a respective row in an image ultimately displayed to the user. The controller may instruct the optics system to adjust the light. For example, the controller may control the optics system to scan the presented discrete sections to different areas of a coupling element of the output waveguide. Accordingly, at the exit pupil of the output waveguide, each discrete portion may be presented in a different location. While each discrete section is presented at different times, the presentation and scanning of the discrete sections may occur fast enough such that a user's eye integrates the different sections into a single image or series of images. The controller may also provide scanning instructions to the light source that include an address corresponding to an individual source element of the light source and/or an electrical bias applied to the individual source element.

A controller may include an image processing unit. The controller, or component image processing unit, may include a general-purpose processor and/or one or more application-specific circuits that are dedicated to performing the features described herein. In one embodiment, a general-purpose processor may be coupled to a memory device to execute software instructions that cause the processor to perform certain processes described herein. In some embodiments, the image processing unit may include one or more circuits that are dedicated to performing certain features. The image processing unit may be a stand-alone unit that is separate from the controller and the driver circuit, but in some embodiments the image processing unit may be a sub-unit of the controller or the driver circuit. In other words, in those embodiments, the controller or the driver circuit performs various image processing procedures of the image processing unit. The image processing unit may also be referred to as an image processing circuit.

Ophthalmic applications of the devices described herein include spectacles with a flat front (or other curved) substrate and an adjustable eye-side concave or convex membrane surface. Applications include optics, and other applications of fluid lenses, including augmented reality or virtual reality headsets.

Embodiments of the present disclosure may include or be implemented in conjunction with various types of artificial reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial reality systems may be designed to work without near-eye displays (NEDs). Other artificial reality systems may include an NED that also provides visibility into the real world (e.g., augmented-reality system 2000 in FIG. 20) or that visually immerses a user in an artificial reality (e.g., virtual-reality system 2100 in FIG. 21). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 20:
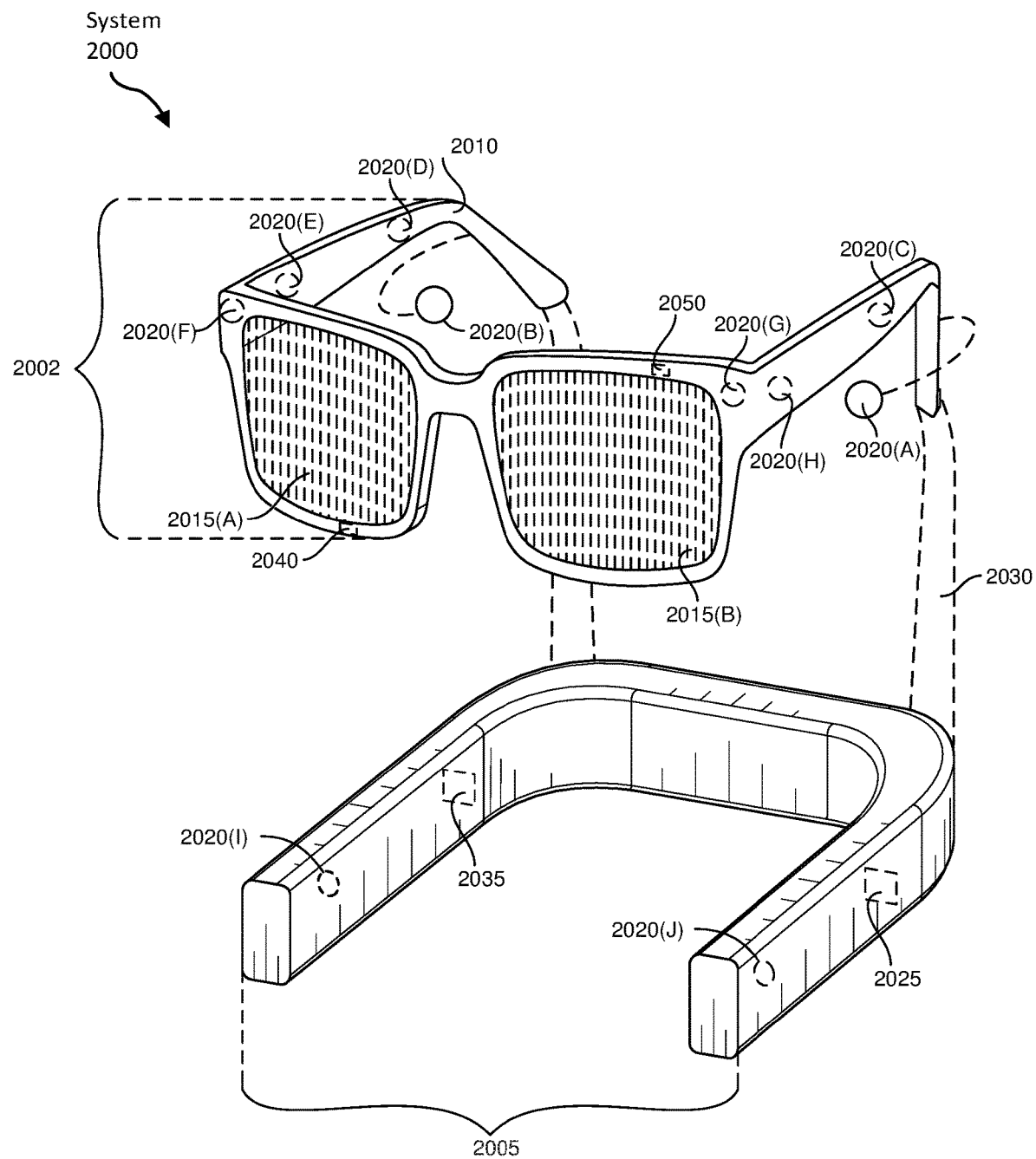
FIG. 20 is an illustration of exemplary augmented-reality glasses that may be used in connection with embodiments of this disclosure.

Turning to FIG. 20, augmented-reality system 2000 may include an eyewear device 2002 with a frame 2010 configured to hold a left display device 2015(A) and a right display device 2015(B) in front of a user's eyes. Display devices 2015(A) and 2015(B) may act together or independently to present an image or series of images to a user. While augmented-reality system 2000 includes two displays, embodiments of this disclosure may be implemented in augmented-reality systems with a single NED or more than two NEDs.

In some embodiments, augmented-reality system 2000 may include one or more sensors, such as sensor 2040. Sensor 2040 may generate measurement signals in response to motion of augmented-reality system 2000 and may be located on substantially any portion of frame 2010. Sensor 2040 may represent a position sensor, an inertial measurement unit (IMU), a depth camera assembly, a structured light emitter and/or detector, or any combination thereof. In some embodiments, augmented-reality system 2000 may or may not include sensor 2040 or may include more than one sensor. In embodiments in which sensor 2040 includes an IMU, the IMU may generate calibration data based on measurement signals from sensor 2040. Examples of sensor 2040 may include, without limitation, accelerometers, gyroscopes, magnetometers, other suitable types of sensors that detect motion, sensors used for error correction of the IMU, or some combination thereof.

Augmented-reality system 2000 may also include a microphone array with a plurality of acoustic transducers 2020(A)-2020(J), referred to collectively as acoustic transducers 2020. Acoustic transducers 2020 may be transducers that detect air pressure variations induced by sound waves. Each acoustic transducer 2020 may be configured to detect sound and convert the detected sound into an electronic format (e.g., an analog or digital format). The microphone array in FIG. 20 may include, for example, ten acoustic transducers: 2020(A) and 2020(B), which may be designed to be placed inside a corresponding ear of the user, acoustic transducers 2020(C), 2020(D), 2020(E), 2020(F), 2020(G), and 2020(H), which may be positioned at various locations on frame 2010, and/or acoustic transducers 2020(1) and 2020(J), which may be positioned on a corresponding neckband 2005.

In some embodiments, one or more of acoustic transducers 2020(A)-(F) may be used as output transducers (e.g., speakers). For example, acoustic transducers 2020(A) and/ or 2020(B) may be earbuds or any other suitable type of headphone or speaker.

The configuration of acoustic transducers 2020 of the microphone array may vary. While augmented-reality system 2000 is shown in FIG. 20 as having ten acoustic transducers 2020, the number of acoustic transducers 2020 may be greater or less than ten. In some embodiments, using higher numbers of acoustic transducers 2020 may increase the amount of audio information collected and/or the sensitivity and accuracy of the audio information. In contrast, using a lower number of acoustic transducers 2020 may decrease the computing power required by an associated controller 2050 to process the collected audio information. In addition, the position of each acoustic transducer 2020 of the microphone array may vary. For example, the position of an acoustic transducer 2020 may include a defined position on the user, a defined coordinate on frame 2010, an orientation associated with each acoustic transducer 2020, or some combination thereof.

Acoustic transducers 2020(A) and 2020(B) may be positioned on different parts of the user's ear, such as behind the pinna, behind the tragus, and/or within the auricle or fossa. Or, there may be additional acoustic transducers 2020 on or surrounding the ear in addition to acoustic transducers 2020 inside the ear canal. Having an acoustic transducer 2020 positioned next to an ear canal of a user may enable the microphone array to collect information on how sounds arrive at the ear canal. By positioning at least two of acoustic transducers 2020 on either side of a user's head (e.g., as binaural microphones), augmented-reality device 2000 may simulate binaural hearing and capture a 3D stereo sound field around about a user's head. In some embodiments, acoustic transducers 2020(A) and 2020(B) may be connected to augmented-reality system 2000 via a wired connection 2030, and in other embodiments acoustic transducers 2020(A) and 2020(B) may be connected to augmented-reality system 2000 via a wireless connection (e.g., a Bluetooth connection). In still other embodiments, acoustic transducers 2020(A) and 2020(B) may not be used at all in conjunction with augmented-reality system 2000.

Acoustic transducers 2020 on frame 2010 may be positioned along the length of the temples, across the bridge, above or below display devices 2015(A) and 2015(B), or some combination thereof. Acoustic transducers 2020 may be oriented such that the microphone array is able to detect sounds in a wide range of directions surrounding the user wearing the augmented-reality system 2000. In some embodiments, an optimization process may be performed during manufacturing of augmented-reality system 2000 to determine relative positioning of each acoustic transducer 2020 in the microphone array.

In some examples, augmented-reality system 2000 may include or be connected to an external device (e.g., a paired device), such as neckband 2005. Neckband 2005 generally represents any type or form of paired device. Thus, the following discussion of neckband 2005 may also apply to various other paired devices, such as charging cases, smart watches, smart phones, wrist bands, other wearable devices, hand-held controllers, tablet computers, laptop computers, other external compute devices, etc.

As shown, neckband 2005 may be coupled to eyewear device 2002 via one or more connectors. The connectors may be wired or wireless and may include electrical and/or non-electrical (e.g., structural) components. In some cases, eyewear device 2002 and neckband 2005 may operate independently without any wired or wireless connection between them. While FIG. 20 illustrates the components of eyewear device 2002 and neckband 2005 in example locations on eyewear device 2002 and neckband 2005, the components may be located elsewhere and/or distributed differently on eyewear device 2002 and/or neckband 2005. In some embodiments, the components of eyewear device 2002 and neckband 2005 may be located on one or more additional peripheral devices paired with eyewear device 2002, neckband 2005, or some combination thereof.

Pairing external devices, such as neckband 2005, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 2000 may be provided by a paired device or shared between a paired device and an eyewear device, thus reducing the weight, heat profile, and form factor of the eyewear device overall while still retaining desired functionality. For example, neckband 2005 may allow components that would otherwise be included on an eyewear device to be included in neckband 2005 since users may tolerate a heavier weight load on their shoulders than they would tolerate on their heads. Neckband 2005 may also have a larger surface area over which to diffuse and disperse heat to the ambient environment. Thus, neckband 2005 may allow for greater battery and computation capacity than might otherwise have been possible on a stand-alone eyewear device. Since weight carried in neckband 2005 may be less invasive to a user than weight carried in eyewear device 2002, a user may tolerate wearing a lighter eyewear device and carrying or wearing the paired device for greater lengths of time than a user would tolerate wearing a heavy stand-alone eyewear device, thereby enabling users to more fully incorporate artificial reality environments into their day-to-day activities.

Neckband 2005 may be communicatively coupled with eyewear device 2002 and/or to other devices. These other devices may provide certain functions (e.g., tracking, localizing, depth mapping, processing, storage, etc.) to augmented-reality system 2000. In the embodiment of FIG. 20, neckband 2005 may include two acoustic transducers (e.g., 2020(1) and 2020(J)) that are part of the microphone array (or potentially form their own microphone subarray). Neckband 2005 may also include a controller 2025 and a power source 2035.

Acoustic transducers 2020(1) and 2020(J) of neckband 2005 may be configured to detect sound and convert the detected sound into an electronic format (analog or digital). In the embodiment of FIG. 20, acoustic transducers 2020(1) and 2020(J) may be positioned on neckband 2005, thereby increasing the distance between the neckband acoustic transducers 2020(1) and 2020(J) and other acoustic transducers 2020 positioned on eyewear device 2002. In some cases, increasing the distance between acoustic transducers 2020 of the microphone array may improve the accuracy of beamforming performed via the microphone array. For example, if a sound is detected by acoustic transducers 2020(C) and 2020(D) and the distance between acoustic transducers 2020(C) and 2020(D) is greater than, for example, the distance between acoustic transducers 2020(D) and 2020(E), the determined source location of the detected sound may be more accurate than if the sound had been detected by acoustic transducers 2020(D) and 2020(E).

Controller 2025 of neckband 2005 may process information generated by the sensors on neckband 2005 and/or augmented-reality system 2000. For example, controller 2025 may process information from the microphone array that describes sounds detected by the microphone array. For each detected sound, controller 2025 may perform a direction-of-arrival (DOA) estimation to estimate a direction from which the detected sound arrived at the microphone array. As the microphone array detects sounds, controller 2025 may populate an audio data set with the information. In embodiments in which augmented-reality system 2000 includes an inertial measurement unit, controller 2025 may compute all inertial and spatial calculations from the IMU located on eyewear device 2002. A connector may convey information between augmented-reality system 2000 and neckband 2005 and between augmented-reality system 2000 and controller 2025. The information may be in the form of optical data, electrical data, wireless data, or any other transmittable data form. Moving the processing of information generated by augmented-reality system 2000 to neckband 2005 may reduce weight and heat in eyewear device 2002, making it more comfortable to the user.

Power source 2035 in neckband 2005 may provide power to eyewear device 2002 and/or to neckband 2005. Power source 2035 may include, without limitation, lithium ion batteries, lithium-polymer batteries, primary lithium batteries, alkaline batteries, or any other form of power storage. In some cases, power source 2035 may be a wired power source. Including power source 2035 on neckband 2005 instead of on eyewear device 2002 may help better distribute the weight and heat generated by power source 2035.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 2100 in FIG. 21, that mostly or completely covers a user's field of view. Virtual-reality system 2100 may include a front rigid body 2102 and a band 2104 shaped to fit around a user's head. Virtual-reality system 2100 may also include output audio transducers 2106(A) and 2106(B). Furthermore, while not shown in FIG. 21, front rigid body 2102 may include one or more electronic elements, including one or more electronic displays, one or more inertial measurement units (IMUS), one or more tracking emitters or detectors, and/or any other suitable device or system for creating an artificial reality experience.

Artificial reality systems may include a variety of types of visual feedback mechanisms. For example, display devices in augmented-reality system 2000 and/or virtual-reality system 2100 may include one or more liquid crystal displays (LCDs), light emitting diode (LED) displays, organic LED (OLED) displays digital light project (DLP) micro-displays, liquid crystal on silicon (LCoS) micro-displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some artificial reality systems may include one or more projection systems. For example, display devices in augmented-reality system 2000 and/or virtual-reality system 2100 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. The display devices may accomplish this using any of a variety of different optical components, including waveguides components (e.g., holographic, planar, diffractive, polarized, and/or reflective waveguide elements), light-manipulation surfaces and elements (such as diffractive, reflective, and refractive elements and gratings), coupling elements, etc. Artificial reality systems may also be configured with any other suitable type or form of image projection system, such as retinal projectors used in virtual retina displays.

Artificial reality systems may also include various types of computer vision components and subsystems. For example, augmented-reality system augmented-reality system 2000 and/or virtual-reality system 2100 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

Artificial reality systems may also include one or more input and/or output audio transducers. Examples may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

In some examples, artificial reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial reality experience in one or more of these contexts and environments and/or in other contexts and environments.

As noted, artificial reality systems 2000 and 2100 may be used with a variety of other types of devices to provide a more compelling artificial reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 22:
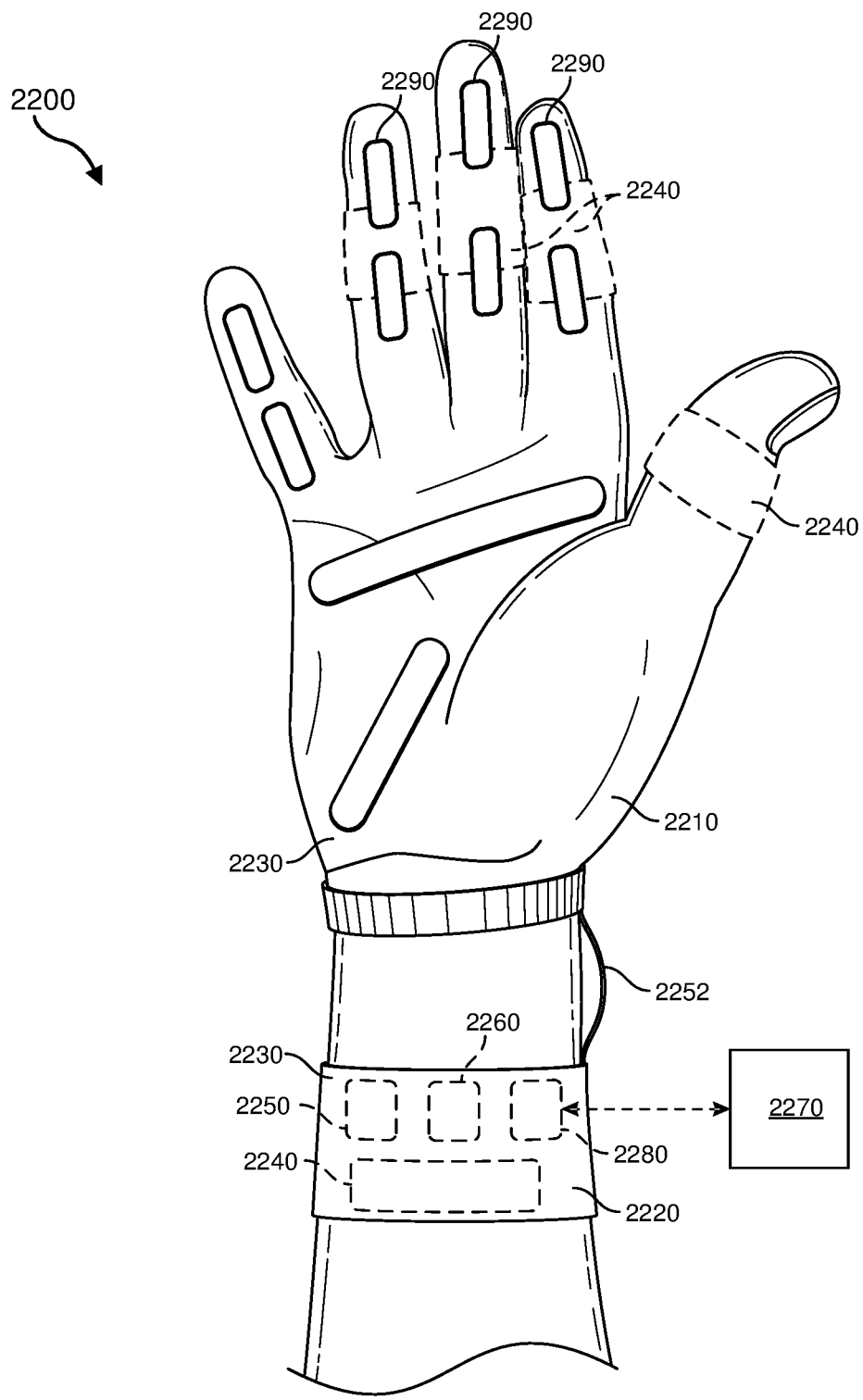
FIG. 22 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 22 illustrates a vibrotactile system 2200 in the form of a wearable glove (haptic device 2210) and wristband (haptic device 2220). Haptic device 2210 and haptic device 2220 are shown as examples of wearable devices that include a flexible, wearable textile material 2230 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, nonwoven fabric, leather, cloth, a flexible polymer material, composite materials, etc.

One or more vibrotactile devices 2240 may be positioned at least partially within one or more corresponding pockets formed in textile material 2230 of vibrotactile system 2200. Vibrotactile devices 2240 may be positioned in locations to provide a vibrating sensation (e.g., haptic feedback) to a user of vibrotactile system 2200. For example, vibrotactile devices 2240 may be positioned against the user's finger(s), thumb, or wrist, as shown in FIG. 22. Vibrotactile devices 2240 may, in some examples, be sufficiently flexible to conform to or bend with the user's corresponding body part(s).

A power source 2250 (e.g., a battery) for applying a voltage to the vibrotactile devices 2240 for activation thereof may be electrically coupled to vibrotactile devices 2240, such as via conductive wiring 2252. In some examples, each of vibrotactile devices 2240 may be independently electrically coupled to power source 2250 for individual activation. In some embodiments, a processor 2260 may be operatively coupled to power source 2250 and configured (e.g., programmed) to control activation of vibrotactile devices 2240.

Vibrotactile system 2200 may be implemented in a variety of ways. In some examples, vibrotactile system 2200 may be a standalone system with integral subsystems and components for operation independent of other devices and systems. As another example, vibrotactile system 2200 may be configured for interaction with another device or system 2270. For example, vibrotactile system 2200 may, in some examples, include a communications interface 2280 for receiving and/or sending signals to the other device or system 2270. The other device or system 2270 may be a mobile device, a gaming console, an artificial reality (e.g., virtual reality, augmented reality, mixed reality) device, a personal computer, a tablet computer, a network device (e.g., a modem, a router, etc.), a handheld controller, etc. Communications interface 2280 may enable communications between vibrotactile system 2200 and the other device or system 2270 via a wireless (e.g., Wi-Fi, Bluetooth, cellular, radio, etc.) link or a wired link. If present, communications interface 2280 may be in communication with processor 2260, such as to provide a signal to processor 2260 to activate or deactivate one or more of the vibrotactile devices 2240.

Vibrotactile system 2200 may optionally include other subsystems and components, such as touch-sensitive pads 2290, pressure sensors, motion sensors, position sensors, lighting elements, and/or user interface elements (e.g., an on/off button, a vibration control element, etc.). During use, vibrotactile devices 2240 may be configured to be activated for a variety of different reasons, such as in response to the user's interaction with user interface elements, a signal from the motion or position sensors, a signal from the touch-sensitive pads 2290, a signal from the pressure sensors, a signal from the other device or system 2270, etc.

Although power source 2250, processor 2260, and communications interface 2280 are illustrated in FIG. 22 as being positioned in haptic device 2220, the present disclosure is not so limited. For example, one or more of power source 2250, processor 2260, or communications interface 2280 may be positioned within haptic device 2210 or within another wearable textile.

Figure 23:
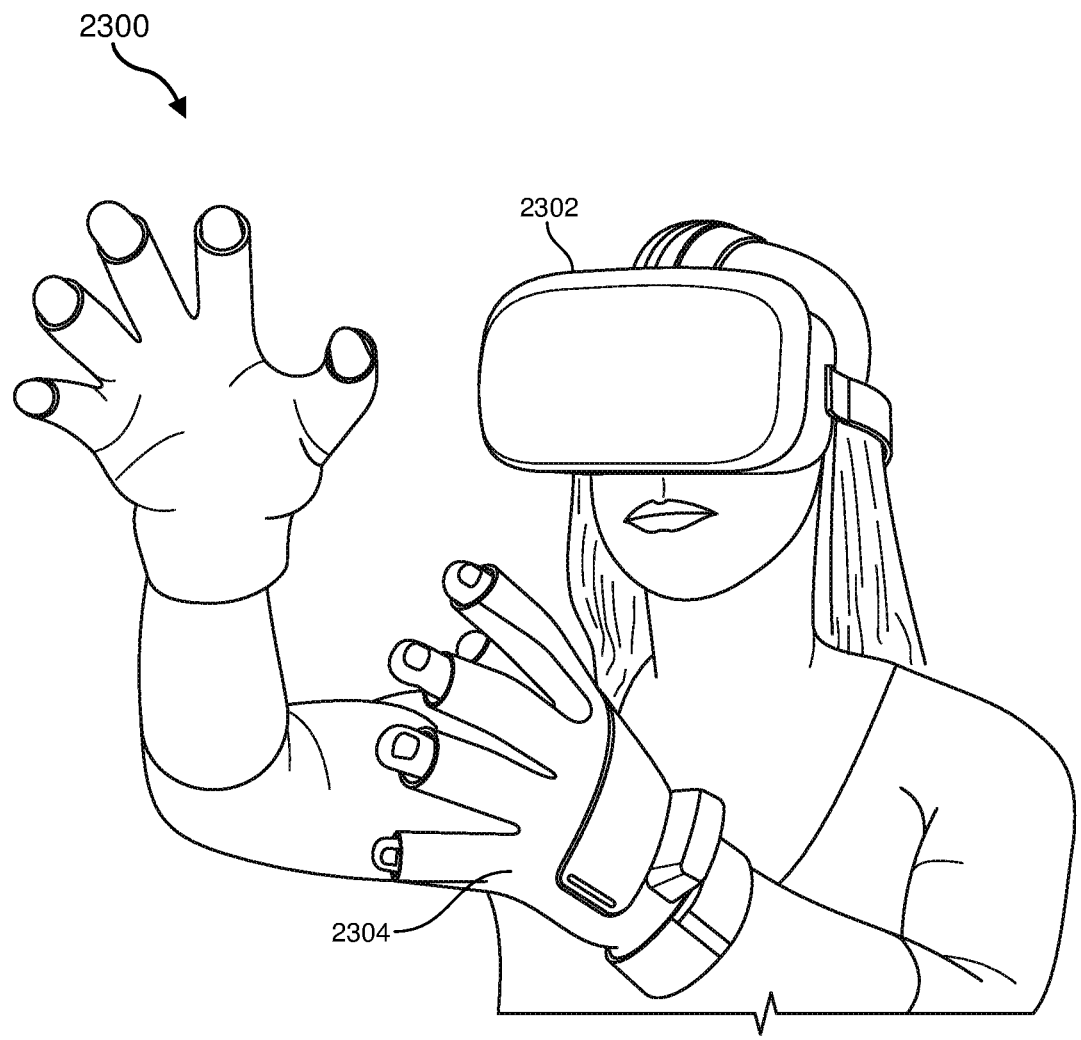
FIG. 23 is an illustration of an exemplary virtual-reality environment according to embodiments of this disclosure.

Haptic wearables, such as those shown in and described in connection with FIG. 22, may be implemented in a variety of types of artificial-reality systems and environments. FIG. 23 shows an example artificial reality environment 2300 including one head-mounted virtual-reality display and two haptic devices (i.e., gloves), and in other embodiments any number and/or combination of these components and other components may be included in an artificial reality system. For example, in some embodiments there may be multiple head-mounted displays each having an associated haptic device, with each head-mounted display and each haptic device communicating with the same console, portable computing device, or other computing system.

Figure 21:
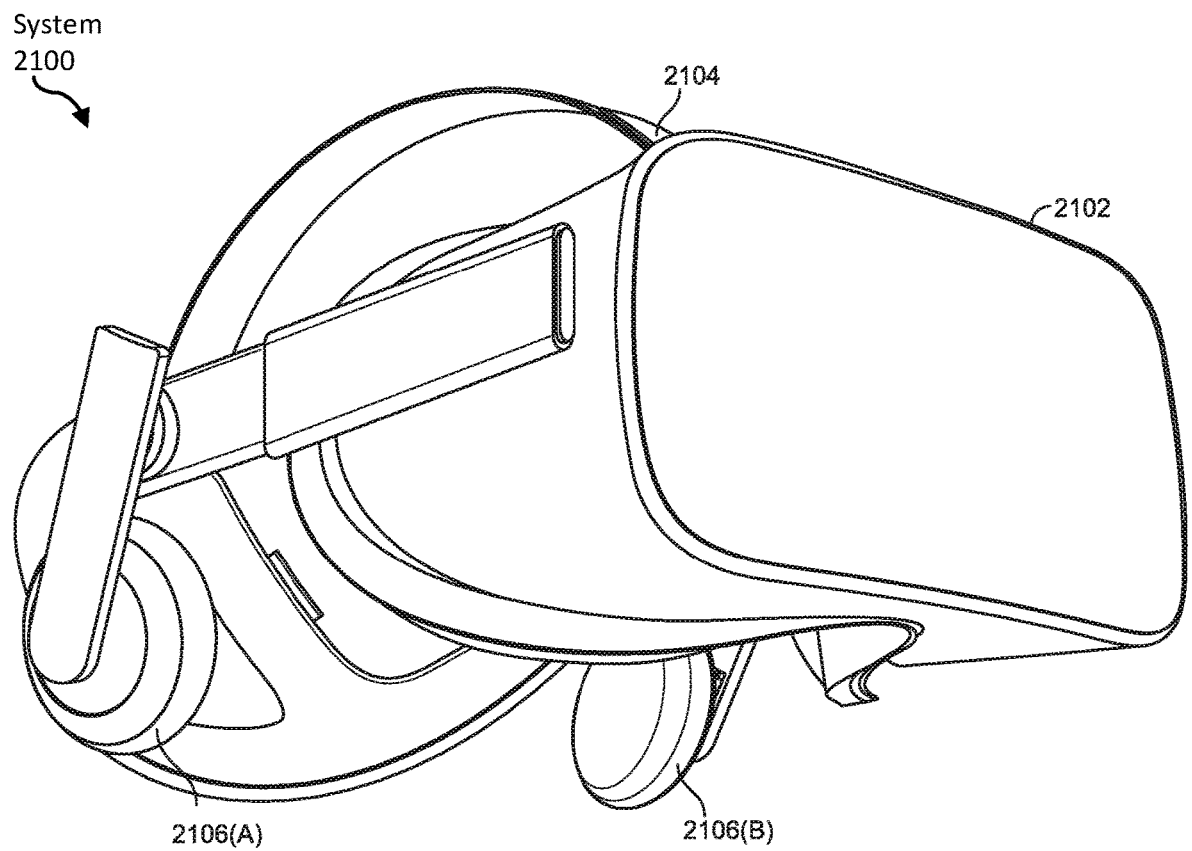
FIG. 21 is an illustration of an exemplary virtual-reality headset that may be used in connection with embodiments of this disclosure.

Head-mounted display 2302 generally represents any type or form of virtual-reality system, such as virtual-reality system 2100 in FIG. 21. Haptic device 2304 generally represents any type or form of wearable device, worn by a user of an artificial reality system, that provides haptic feedback to the user to give the user the perception that he or she is physically engaging with a virtual object. In some embodiments, haptic device 2304 may provide haptic feedback by applying vibration, motion, and/or force to the user. For example, haptic device 2304 may limit or augment a user's movement. To give a specific example, haptic device 2304 may limit a user's hand from moving forward so that the user has the perception that his or her hand has come in physical contact with a virtual wall. In this specific example, one or more actuators within the haptic advice may achieve the physical-movement restriction by pumping fluid into an inflatable bladder of the haptic device. In some examples, a user may also use haptic device 2304 to send action requests to a console. Examples of action requests include, without limitation, requests to start an application and/or end the application and/or requests to perform a particular action within the application.

Figure 24:
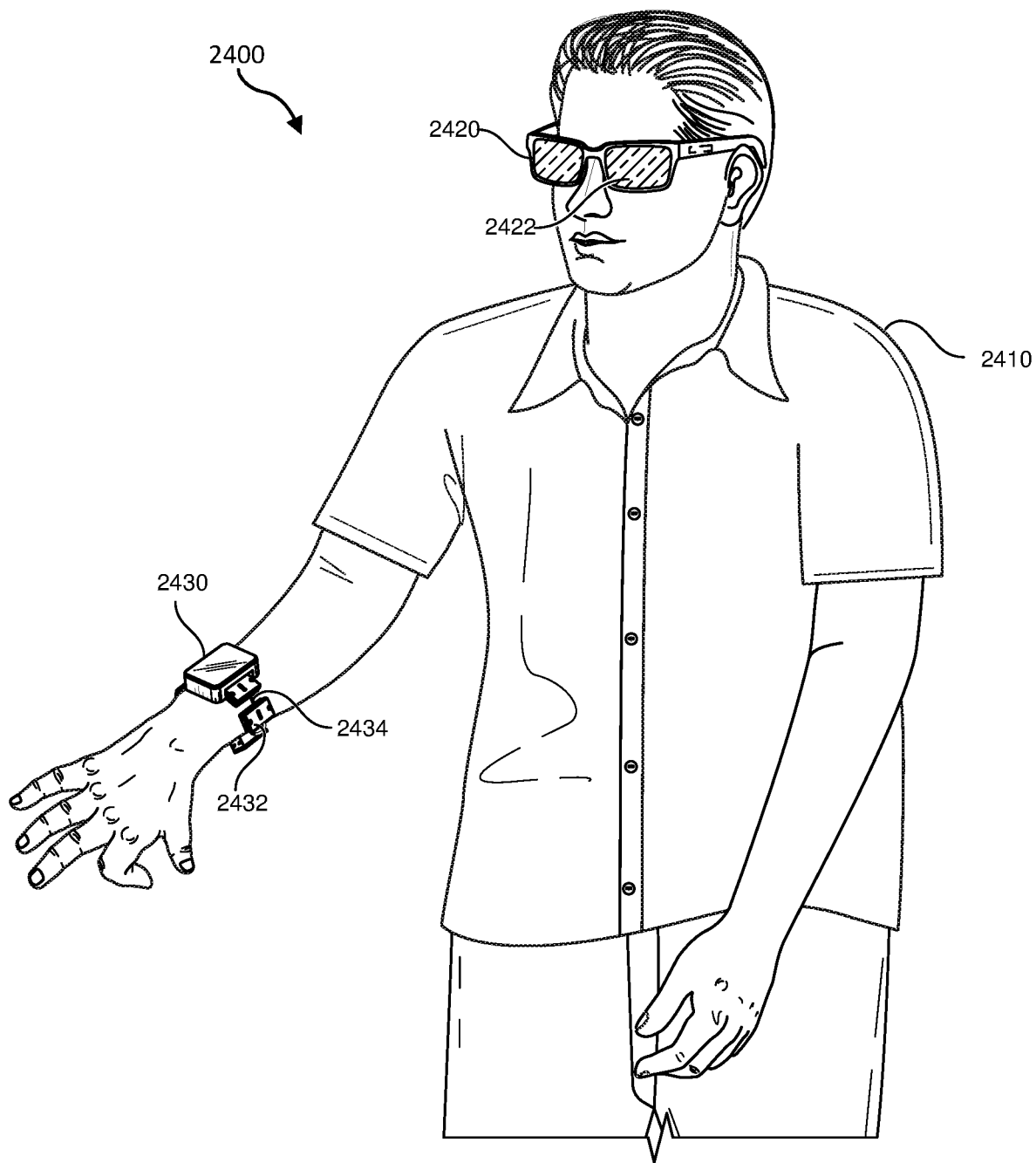
FIG. 24 is an illustration of an exemplary augmented-reality environment according to embodiments of this disclosure.

While haptic interfaces may be used with virtual-reality systems, as shown in FIG. 23, haptic interfaces may also be used with augmented-reality systems, as shown in FIG. 24. FIG. 24 is a perspective view of a user 2410 interacting with an augmented-reality system 2400. In this example, user 2410 may wear a pair of augmented-reality glasses 2420 that may have one or more displays 2422 and that are paired with a haptic device 2430. In this example, haptic device 2430 may be a wristband that includes a plurality of band elements 2432 and a tensioning mechanism 2434 that connects band elements 2432 to one another.

One or more of band elements 2432 may include any type or form of actuator suitable for providing haptic feedback. For example, one or more of band elements 2432 may be configured to provide one or more of various types of cutaneous feedback, including vibration, force, traction, texture, and/or temperature. To provide such feedback, band elements 2432 may include one or more of various types of actuators. In one example, each of band elements 2432 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 2210, 2220, 2304, and 2430 may include any suitable number and/or type of haptic transducer, sensor, and/or feedback mechanism. For example, haptic devices 2210, 2220, 2304, and 2430 may include one or more mechanical transducers, piezoelectric transducers, and/or fluidic transducers. Haptic devices 2210, 2220, 2304, and 2430 may also include various combinations of different types and forms of transducers that work together or independently to enhance a user's artificial-reality experience. In one example, each of band elements 2432 of haptic device 2430 may include a vibrotactor (e.g., a vibrotactile actuator) configured to vibrate in unison or independently to provide one or more of various types of haptic sensations to a user.

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the devices or modules described herein may transform data, physical devices, and/or representations of physical devices from one form to another. For example, one or more of the modules recited herein may receive data to be transformed, transform the data, output a result of the transformation to, for example, to perform a function, use the result of the transformation to perform a function, and store the result of the transformation to perform a function. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

Features from any of the embodiments described herein may be used in combination with one another in accordance with the general principles described herein. These and other embodiments, features, and advantages will be more fully understood upon reading the following detailed description in conjunction with the accompanying drawings and claims.

What is claimed is:

1. A method, comprising:
    forming a material layer on a substrate, the material layer comprising fluid-filled voids within a partially polymerized matrix;
    deforming the material layer to form anisotropic voids within the partially polymerized matrix; and
    polymerizing the material layer to form an anisotropic voided polymer comprising the anisotropic voids within a polymer matrix;
    wherein forming the material layer on the substrate comprises:
        forming a layer on the substrate, the layer comprising the fluid-filled voids within a medium, the medium comprising a polymerizable component; and
        partially polymerizing the polymerizable component to form the material layer.

2. The method of claim 1, further comprising removing a liquid from the anisotropic voided polymer to produce gas-filled anisotropic voids within the anisotropic voided polymer.

3. The method of claim 1, wherein deforming the material layer comprises stretching the material layer.

4. The method of claim 1, wherein deforming the material layer comprises stretching the substrate.

5. The method of claim 4, wherein stretching the substrate comprises stretching the substrate using one or more rollers.

6. The method of claim 4, wherein stretching the substrate comprises stretching the substrate in two orthogonal directions.

7. The method of claim 1, wherein deforming the material layer comprises compressing the material layer along at least one direction.

8. The method of claim 1, wherein deforming the material layer comprises applying an electric field or magnetic field to the material layer.

9. The method of claim 1, wherein deforming the material layer comprises removing a fluid component from the fluid-filled voids,
    wherein removing the fluid component from the fluid-filled voids induces a partial collapse of the fluid-filled voids.

10. The method of claim 1, further comprising removing the anisotropic voided polymer from the substrate.

11. The method of claim 1, further comprising depositing electrodes on the anisotropic voided polymer so that at least a portion of the anisotropic voided polymer is located between the electrodes.

12. The method of claim 1, further comprising forming an electroactive device using the anisotropic voided polymer, wherein the electroactive device is a sensor or an actuator.

13. The method of claim 1, wherein the polymer matrix is an electroactive polymer matrix.

14. The method of claim 1, wherein the polymer matrix comprises at least one of a silicone polymer, or an acrylate polymer.

15. The method of claim 1, wherein the partially polymerized matrix comprises at least one polymer having a degree of polymerization between 20% and 80%.

16. The method of claim 1, wherein the partially polymerized matrix comprises at least one polymer having a degree of polymerization between 30% and 70%.

* * * * *